(12) United States Patent
Hussell et al.

(10) Patent No.: US 11,695,102 B2
(45) Date of Patent: Jul. 4, 2023

(54) ACTIVE ELECTRICAL ELEMENTS WITH LIGHT-EMITTING DIODES

(71) Applicant: CreeLED, Inc., Durham, NC (US)

(72) Inventors: Christopher P. Hussell, Cary, NC (US); Zhenyu Zhong, Tseung Kwan O (HK)

(73) Assignee: CreeLED, Inc., Durham, NC (US)

( * ) Notice: Subject to any disclaimer, the term of this patent is extended or adjusted under 35 U.S.C. 154(b) by 101 days.

(21) Appl. No.: 16/906,129

(22) Filed: Jun. 19, 2020

(65) Prior Publication Data
US 2021/0399183 A1 Dec. 23, 2021

(51) Int. Cl.
| | |
|---|---|
| *G06F 3/044* | (2006.01) |
| *G09G 3/32* | (2016.01) |
| *H01L 33/62* | (2010.01) |
| *H01L 25/16* | (2023.01) |

(52) U.S. Cl.
CPC .............. *H01L 33/62* (2013.01); *G06F 3/044* (2013.01); *G09G 3/32* (2013.01); *H01L 25/167* (2013.01)

(58) Field of Classification Search
CPC .......... H01L 33/62; H01L 25/167; G09G 3/32
USPC ................................................ 257/79; 438/22
See application file for complete search history.

(56) References Cited

U.S. PATENT DOCUMENTS

| | | | |
|---|---|---|---|
| 5,359,345 | A | 10/1994 | Hunter |
| 6,016,038 | A | 1/2000 | Mueller et al. |
| 6,150,774 | A | 11/2000 | Mueller et al. |
| 6,166,496 | A | 12/2000 | Lys et al. |
| 6,211,626 | B1 | 4/2001 | Lys et al. |
| 6,292,901 | B1 | 9/2001 | Lys et al. |

(Continued)

FOREIGN PATENT DOCUMENTS

| | | |
|---|---|---|
| JP | 2002229502 A | 8/2002 |
| WO | 2020030993 A1 | 2/2020 |

OTHER PUBLICATIONS

Author Unknown, "APA102-2020 Super LED," Datasheet, Shenzhen LED Color Opto Electronic Co., Ltd., retrieved Apr. 10, 2019 from http://www.led-color.com/upload/201604/APA102-2020%20SMD%20LED.pdf, 6 pages.

(Continued)

*Primary Examiner* — Didarul A Mazumder
(74) *Attorney, Agent, or Firm* — Withrow & Terranova, P.L.L.C.

(57) ABSTRACT

Light-emitting devices with active electrical elements and light-emitting diodes (LEDs) are disclosed. LEDs may be mounted on an active electrical element such that the LEDs are within peripheral edges of the active electrical element. Contact pads may be arranged on the active electrical element for receiving external power and communication signals for active control of the LEDs. A light-transmissive carrier may be positioned over the active electrical element and the LEDs. Electrical traces of the carrier may be configured to electrically connect with the contact pads to route external power connections and communication signals for the active electrical element. Other electrical traces of the carrier may form a touch sensing element that is electrically coupled with the active electrical element. Active electrical elements with LEDs provided thereon may form compact sizes for use as active LED pixels configured for active-matrix addressing within an LED display.

22 Claims, 16 Drawing Sheets

(56) References Cited

U.S. PATENT DOCUMENTS

| | | |
|---|---|---|
| 6,538,626 B1 | 3/2003 | Nieberger et al. |
| 7,206,001 B1 | 4/2007 | Crandall et al. |
| 7,579,629 B2 | 8/2009 | Inoguchi |
| 8,111,001 B2 | 2/2012 | Underwood et al. |
| 8,328,405 B2 | 12/2012 | Negley |
| 8,922,458 B2 | 12/2014 | Sefton et al. |
| 8,937,492 B1 | 1/2015 | Gideon |
| 8,970,131 B2 | 3/2015 | Brandes et al. |
| 9,414,454 B2 | 8/2016 | Brandes et al. |
| 9,717,123 B1 | 7/2017 | Yao |
| 10,368,411 B2 | 7/2019 | Zhang et al. |
| 10,384,239 B2 | 8/2019 | Fedigan et al. |
| 10,453,827 B1 | 10/2019 | Hussell et al. |
| 10,663,418 B2 | 5/2020 | Magee et al. |
| 10,682,675 B2 | 6/2020 | Magee et al. |
| 10,695,805 B2 | 6/2020 | Magee et al. |
| 10,908,414 B2 | 2/2021 | Revier et al. |
| 2001/0028356 A1 | 10/2001 | Balogh |
| 2002/0130627 A1 | 9/2002 | Morgan et al. |
| 2003/0058885 A1 | 3/2003 | Sorenson et al. |
| 2004/0160199 A1 | 8/2004 | Morgan et al. |
| 2004/0246278 A1 | 12/2004 | Elliott |
| 2006/0022214 A1 | 2/2006 | Morgan et al. |
| 2006/0114269 A1 | 6/2006 | Chang-Ho et al. |
| 2007/0097055 A1 | 5/2007 | Takamura et al. |
| 2007/0195025 A1 | 8/2007 | Korcharz et al. |
| 2007/0231846 A1 | 10/2007 | Cosentino et al. |
| 2008/0018261 A1 | 1/2008 | Kastner |
| 2008/0062158 A1 | 3/2008 | Willis |
| 2008/0245949 A1 | 10/2008 | Morimoto et al. |
| 2009/0066526 A1 | 3/2009 | Marshall et al. |
| 2009/0079362 A1 | 3/2009 | Shteynberg et al. |
| 2009/0147028 A1 | 6/2009 | Sefton et al. |
| 2009/0179843 A1 | 7/2009 | Ackerman et al. |
| 2009/0201274 A1 | 8/2009 | Kuwabara et al. |
| 2009/0230885 A1 | 9/2009 | Tanaka |
| 2009/0278034 A1 | 11/2009 | Ackermann et al. |
| 2010/0026208 A1 | 2/2010 | Shteynberg et al. |
| 2010/0102734 A1 | 4/2010 | Quick et al. |
| 2010/0156952 A1 | 6/2010 | Arai |
| 2010/0214764 A1 | 8/2010 | Chaves et al. |
| 2011/0057302 A1 | 3/2011 | Spehar et al. |
| 2012/0056864 A1 | 3/2012 | Aioanei |
| 2012/0126711 A1 | 5/2012 | Suminoe et al. |
| 2012/0147567 A1 | 6/2012 | Lee et al. |
| 2012/0218754 A1 | 8/2012 | Maes |
| 2012/0286674 A1 | 11/2012 | Takanashi |
| 2012/0299480 A1 | 11/2012 | Peting et al. |
| 2013/0057763 A1 | 3/2013 | Cha et al. |
| 2013/0076250 A1 | 3/2013 | Logiudice |
| 2014/0128941 A1 | 5/2014 | Williams |
| 2014/0152902 A1 | 6/2014 | Morrisseau |
| 2014/0265919 A1 | 9/2014 | Pope et al. |
| 2014/0306966 A1 | 10/2014 | Kuo et al. |
| 2015/0276144 A1 | 10/2015 | Tudhope et al. |
| 2015/0319814 A1 | 11/2015 | Grotsch et al. |
| 2015/0348496 A1 | 12/2015 | Santos, II et al. |
| 2015/0377695 A1 | 12/2015 | Chang et al. |
| 2016/0071467 A1 | 3/2016 | Elder et al. |
| 2016/0161326 A1 | 6/2016 | Chang et al. |
| 2016/0217762 A1 | 7/2016 | Moon et al. |
| 2016/0293811 A1 | 10/2016 | Hussell et al. |
| 2016/0314730 A1 | 10/2016 | Sampsell |
| 2017/0092198 A1 | 3/2017 | Ryu et al. |
| 2017/0168212 A1 | 6/2017 | Chen et al. |
| 2017/0263828 A1* | 9/2017 | Mao ..................... H01L 33/502 |
| 2017/0294495 A1 | 10/2017 | Shyu et al. |
| 2017/0330856 A1 | 11/2017 | Zou et al. |
| 2018/0033768 A1 | 2/2018 | Kumar et al. |
| 2018/0035018 A1 | 2/2018 | Yamada et al. |
| 2018/0076368 A1 | 3/2018 | Hussell |
| 2018/0114800 A1 | 4/2018 | Pan |
| 2018/0182927 A1* | 6/2018 | Vampola ................. G09G 3/34 |
| 2018/0247608 A1 | 8/2018 | Chen |
| 2018/0261149 A1 | 9/2018 | Lin |
| 2018/0348959 A1 | 12/2018 | Lin et al. |
| 2019/0132921 A1 | 5/2019 | Rumer |
| 2019/0132923 A1 | 5/2019 | Rumer |
| 2019/0149792 A1 | 5/2019 | Luo et al. |
| 2019/0302917 A1 | 10/2019 | Pan |
| 2019/0335081 A1 | 10/2019 | Baar et al. |
| 2019/0371974 A1 | 12/2019 | Hussell |
| 2020/0105179 A1 | 4/2020 | Greenebaum et al. |
| 2020/0105221 A1 | 4/2020 | Marcu et al. |
| 2020/0135093 A1 | 4/2020 | Prathaban et al. |
| 2020/0184900 A1 | 6/2020 | Shin et al. |
| 2020/0203319 A1* | 6/2020 | Lee ..................... H01L 25/0753 |
| 2020/0251050 A1 | 8/2020 | Yee |
| 2020/0309357 A1 | 10/2020 | Hussell et al. |
| 2020/0312220 A1 | 10/2020 | Hussell et al. |
| 2020/0312222 A1 | 10/2020 | Hussell |
| 2020/0312225 A1 | 10/2020 | Hussell |
| 2020/0312226 A1 | 10/2020 | Hussell |
| 2020/0312231 A1 | 10/2020 | Hussell |
| 2021/0005761 A1* | 1/2021 | Tsai ..................... H01L 25/165 |

OTHER PUBLICATIONS

Author Unknown, "APA102C: RGB Full Color LED control IC," iPixel LED, Shiji Lighting, retrieved Apr. 10, 2019 from https://cdn-shop.adafruit.com/datasheets/APA102.pdf, 5 pages.

Author Unknown, "Self-clocking signal," Jul. 1, 2018, Wikipedia, https://en.wikipedia.org/w/index.php?title=Self-clocking_signal&oldid=848405107, 3 pages.

Author Unknown, "Serial communication," May 2, 2019, Wikipedia, https://en.wikipedia.org/w/index.php?title=Serial_communication&oldid=895110130, 4 pages.

Author Unknown, "SK6812 Technical Data Sheet," Shenzhen LED Color Optoelectronic Co., Ltd., retrieved Apr. 10, 2019 from https://cdn-shop.adafruit.com/product-files/1138/SK6812+LED+datasheet+.pdf, 8 pages.

Author Unknown, "SK6812RGBW Specification: Integrated Light Source Intelligent Control of Chip-On-Top SMD Type LED," Jul. 31, 2015, Dongguang Opsco Optpelectronics Co., Ltd., 16 pages.

Author Unknown, "WS2811: Signal line 256 Gray level 3 channal Constant current LED drive IC," Worldsemi, retrieved May 23, 2019 from https://cdn-shop.adafruit.com/datasheets/WS2811.pdf, 7 pages.

Author Unknown, "WS2812: Intelligent control LED integrated light source," Worldsemi, retrieved Apr. 10, 2019 from https://cdn-shop.adafruit.com/datasheets/WS2811.pdf, 5 pages.

Zhu, K., "EC20-6812 Specification: Embedded Control LED," Dec. 19, 2018, Shenzhen Normand Electronic Co., Ltd., 35 pages.

Invitation to Pay Additional Fees and Partial Search for International Patent Application No. PCT/US2020/023140, dated Jun. 16, 2020, 25 pages.

International Search Report and Written Opinion for International Patent Application No. PCT/US2020/023140, dated Aug. 11, 2020, 27 pages.

Non-Final Office Action for U.S. Appl. No. 16/369,003, dated Aug. 21, 2020, 15 pages.

Non-Final Office Action for U.S. Appl. No. 16/381,116, dated Aug. 21, 2020, 8 pages.

Non-Final Office Action for U.S. Appl. No. 16/437,878, dated Aug. 21, 2020, 14 pages.

Non-Final Office Action for U.S. Appl. No. 16/542,923, dated Aug. 21, 2020, 15 pages.

Final Office Action for U.S. Appl. No. 16/369,003, dated Dec. 9, 2020, 17 pages.

Advisory Action for U.S. Appl. No. 16/369,003, dated Feb. 11, 2021, 3 pages.

Final Office Action for U.S. Appl. No. 16/381,116, dated Dec. 10, 2020, 10 pages.

Advisory Action for U.S. Appl. No. 16/381,116, dated Feb. 11, 2021, 3 pages.

Final Office Action for U.S. Appl. No. 16/437,878, dated Dec. 9, 2020, 14 pages.

Advisory Action and Examiner-Initiated Interview Summary for U.S. Appl. No. 16/437,878, dated Feb. 11, 2021, 4 pages.

(56) References Cited

OTHER PUBLICATIONS

Final Office Action for U.S. Appl. No. 16/542,923, dated Dec. 10, 2020, 16 pages.
Advisory Action and Examiner-Initiated Interview Summary for U.S. Appl. No. 16/542,923, ated Feb. 11, 2021, 4 pages.
Non-Final Office Action for U.S. Appl. No. 16/369,003, dated Nov. 12, 2021, 19 pages.
Non-Final Office Action for U.S. Appl. No. 16/381,116, dated Nov. 12, 2021, 10 pages.
Non-Final Office Action for U.S. Appl. No. 16/437,878, dated Dec. 15, 2021, 17 pages.
Non-Final Office Action for U.S. Appl. No. 16/542,923, dated Nov. 12, 2021, 21 pages.
Final Office Action for U.S. Appl. No. 16/543,009, dated Nov. 12, 2021, 15 pages.
Non-Final Office Action for U.S. Appl. No. 16/815,101, dated Nov. 12, 2021, 13 pages.
Non-Final Office Action for U.S. Appl. No. 17/081,522, dated Jan. 20, 2022, 18 pages.
Final Office Action for U.S. Appl. No. 16/381,116, dated Mar. 2, 2022, 17 pages.
Final Office Action for U.S. Appl. No. 16/542,923, dated Mar. 2, 2022, 21 pages.
Non-Final Office Action for U.S. Appl. No. 16/543,009, dated Mar. 4, 2022, 15 pages.
Final Office Action for U.S. Appl. No. 16/815,101, dated Mar. 2, 2022, 14 pages.
Final Office Action for U.S. Appl. No. 16/369,003, dated Mar. 31, 2022, 23 pages.
Final Office Action for U.S. Appl. No. 16/437,878, dated Mar. 31, 2022, 22 pages.
Advisory Action for U.S. Appl. No. 16/369,003, dated Sep. 23, 2021, 3 pages.
Final Office Action for U.S. Appl. No. 16/437,878, dated Sep. 1, 2021, 16 pages.
Advisory Action for U.S. Appl. No. 16/542,923, dated Sep. 23, 2021, 3 pages.
Advisory Action for U.S. Appl. No. 16/543,009, dated Sep. 23, 2021, 3 pages.
Non-Final Office Action for U.S. Appl. No. 16/369,003, dated Apr. 1, 2021, 18 pages.
Non-Final Office Action for U.S. Appl. No. 16/381,116, dated Apr. 1, 2021, 12 pages.
Non-Final Office Action for U.S. Appl. No. 16/437,878, dated Apr. 1, 2021, 16 pages.
Non-Final Office Action for U.S. Appl. No. 16/437,878, dated Apr. 23, 2021, 17 pages.
Non-Final Office Action for U.S. Appl. No. 16/542,923, dated Apr. 1, 2021, 19 pages.
Non-Final Office Action for U.S. Appl. No. 16/543,009, dated Apr. 1, 2021, 14 pages.
Invitation to Pay Additional Fees and Partial Search for International Patent Application No. PCT/US2021/019708, dated May 25, 2021, 17 pages.
International Search Report and Written Opinion for International Patent Application No. PCT/US2021/019708, dated Jul. 19, 2021, 23 pages.
Final Office Action for U.S. Appl. No. 16/369,003, dated Jul. 22, 2021, 16 pages.
Final Office Action for U.S. Appl. No. 16/381,116, dated Jul. 22, 2021, 9 pages.
Final Office Action for U.S. Appl. No. 16/542,923, dated Jul. 22, 2021, 19 pages.
Final Office Action for U.S. Appl. No. 16/543,009, dated Jul. 23, 2021, 15 pages.
U.S. Appl. No. 15/993,540, filed May 30, 2018.
U.S. Appl. No. 15/997,350, filed Jun. 4, 2018.
U.S. Appl. No. 16/369,003, filed Mar. 29, 2019.
U.S. Appl. No. 16/381,116, filed Apr. 11, 2019.
U.S. Appl. No. 16/437,878, filed Jun. 11, 2019.
U.S. Appl. No. 16/542,923, filed Aug. 16, 2019.
U.S. Appl. No. 16/543,009, filed Aug. 16, 2019.
U.S. Appl. No. 16/815,101, filed Mar. 11, 2020.
Advisory Action and Examiner-Initiated Interview Summary for U.S. Appl. No. 16/381,116, dated May 6, 2022, 4 pages.
Non-Final Office Action for U.S. Appl. No. 16/381,116, dated Jun. 22, 2022, 17 pages.
Advisory Action and Examiner-Initiated Interview Summary for U.S. Appl. No. 16/542,923, dated May 6, 2022, 4 pages.
Non-Final Office Action for U.S. Appl. No. 16/542,923, dated Jun. 22, 2022, 23 pages.
Final Office Action for U.S. Appl. No. 16/543,009, dated Jun. 10, 2022, 16 pages.
Advisory Action and Examiner-Initiated Interview Summary for U.S. Appl. No. 16/815,101, dated May 6, 2022, 4 pages.
Non-Final Office Action for U.S. Appl. No. 16/815,101, dated Jun. 22, 2022, 17 pages.
Final Office Action for U.S. Appl. No. 17/081,522, dated Apr. 28, 2022, 10 pages.
Advisory Action for U.S. Appl. No. 17/081,522, dated Jul. 5, 2022, 3 pages.
Non-Final Office Action for U.S. Appl. No. 16/369,003, dated Jul. 21, 2022, 29 pages.
Final Office Action for U.S. Appl. No. 16/381,116, dated Oct. 4, 2022, 17 pages.
Final Office Action for U.S. Appl. No. 16/437,878, dated Jul. 21, 2022, 23 pages.
Non-Final Office Action for U.S. Appl. No. 16/543,009, dated Oct. 7, 2022, 16 pages.
Final Office Action for U.S. Appl. No. 16/542,923, dated Oct. 7, 2022, 23 pages.
Final Office Action for U.S. Appl. No. 16/815,101, dated Oct. 7, 2022, 16 pages.
Non-Final Office Action for U.S. Appl. No. 17/081,522, dated Aug. 17, 2022, 9 pages.
Non-Final Office Action for U.S. Appl. No. 16/437,878, dated Oct. 27, 2022, 21 pages.
Final Office Action for U.S. Appl. No. 16/542,923, dated Nov. 14, 2022, 29 pages.
Advisory Action and Examiner-Initiated Interview Summary for U.S. Appl. No. 16/542,923, dated Dec. 15, 2022, 4 pages.
Advisory Action and Examiner-Initiated Interview Summary for U.S. Appl. No. 16/815,101, dated Dec. 20, 2022, 4 pages.
Final Office Action for U.S. Appl. No. 17/081,522, dated Nov. 10, 2022, 10 pages.
Final Office Action for U.S. Appl. No. 16/369,003, dated Dec. 12, 2022, 24 pages.
Final Office Action for U.S. Appl. No. 16/369,003, dated Nov. 1, 2022, 23 pages.
Final Office Action for U.S. Appl. No. 16/369,003, dated Nov. 3, 2022, 24 pages.
Reason for Rejection for Japanese Patent Application No. 2021-560354, dated Oct. 11, 2022, 7 pages.
Final Office Action for U.S. Appl. No. 16/437,878, dated Feb. 9, 2023, 21 pages.
Notice of Allowance and Examiner-Initiated Interview Summary for U.S. Appl. No. 16/542,923, dated Mar. 17, 2023, 11 pages.
Final Office Action for U.S. Appl. No. 16/543,009, dated Jan. 19, 2023, 19 pages.
Ex Parte Quayle Action for U.S. Appl. No. 16/815,101, mailed Jan. 19, 2023, 7 pages.
Notice of Allowance for U.S. Appl. No. 16/815,101, dated Feb. 13, 2023, 10 pages.
Advisory Action and Examiner-Initiated Interview Summary for U.S. Appl. No. 17/081,522, dated Jan. 23, 2023, 4 pages.
Non-Final Office Action for U.S. Appl. No. 17/081,522, dated Mar. 2, 2023, 11 pages.
Notice of Reason for Rejection for Japanese Patent Application No. 2021-560354, dated Mar. 10, 2023, 4 pages.
International Search Report and Written Opinion for International Patent Application No. PCT/US2023/061653, dated Apr. 6, 2023, 24 pages.

(56) References Cited

OTHER PUBLICATIONS

Notice of Allowance for U.S. Appl. No. 16/369,003, dated Mar. 30, 2023, 9 pages.
Advisory Action and Examiner-Initiated Interview Summary for U.S. Appl. No. 16/437,878, dated Apr. 14, 2023, 4 pages.
Advisory Action and Examiner-Initiated Interview Summary for U.S. Appl. No. 16/543,009, dated Mar. 28, 2023, 4 pages.

* cited by examiner

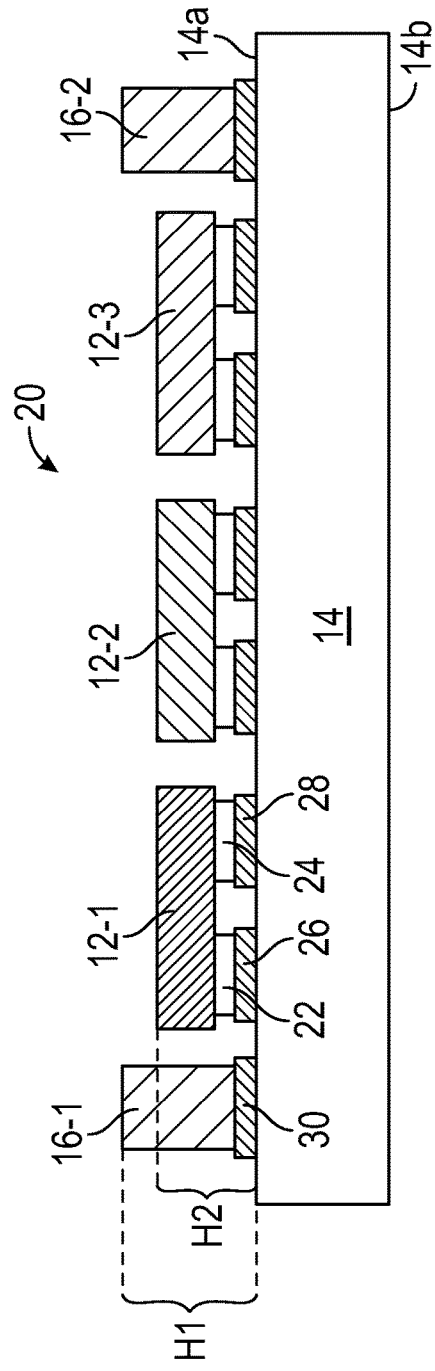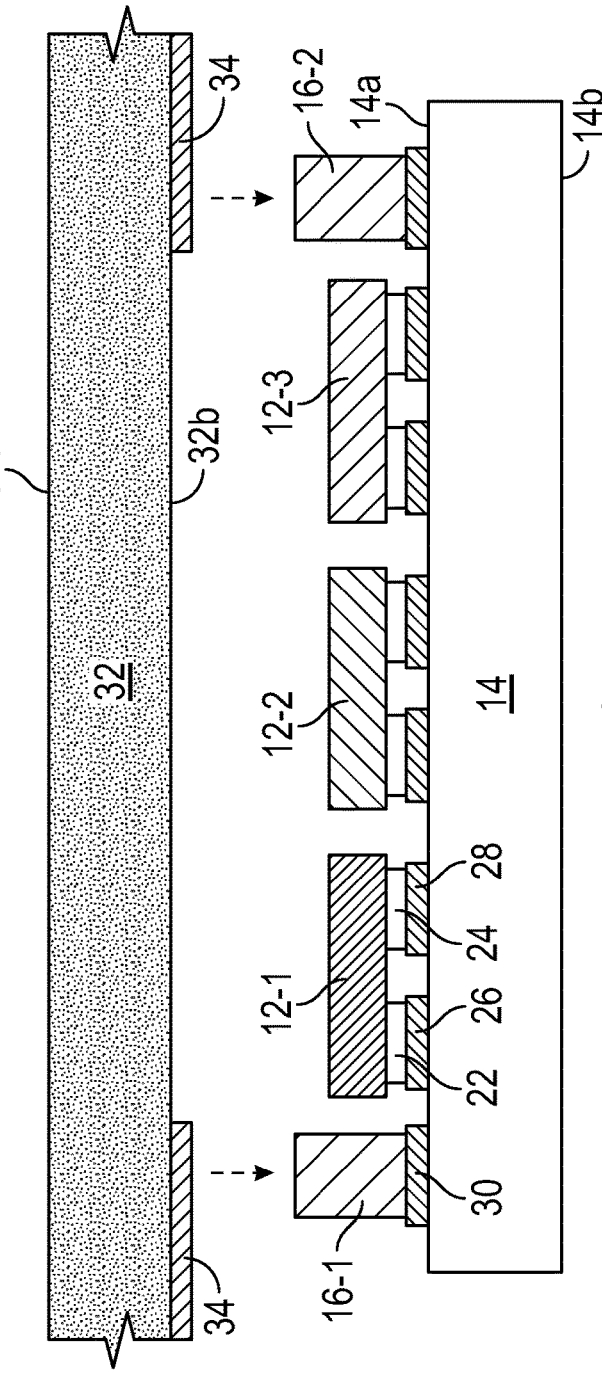
FIG. 3A
FIG. 3B

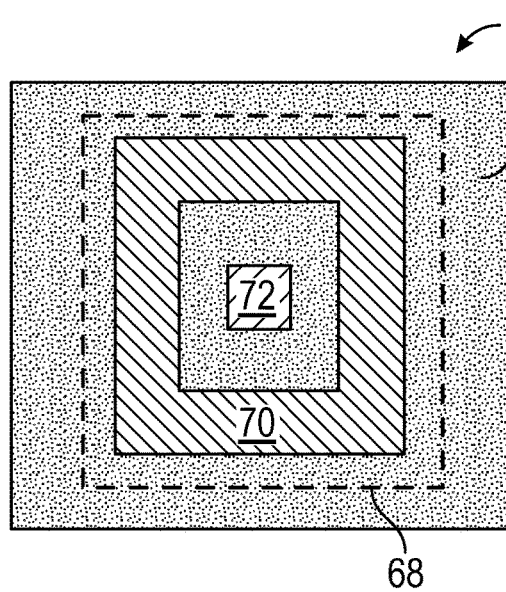
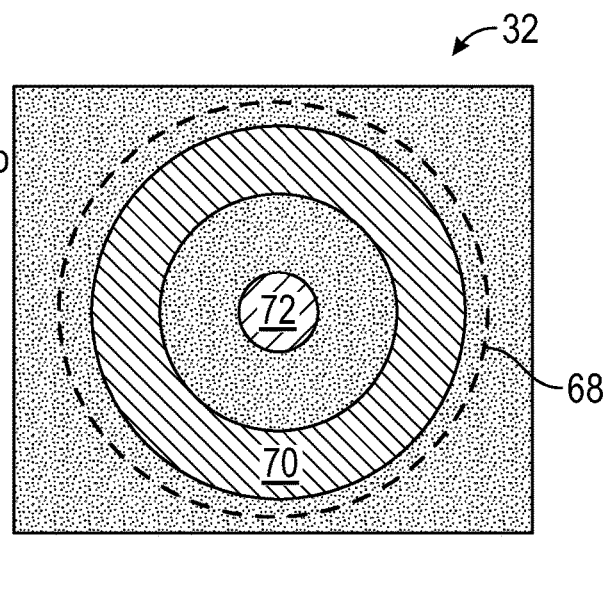
FIG. 12A  FIG. 12B
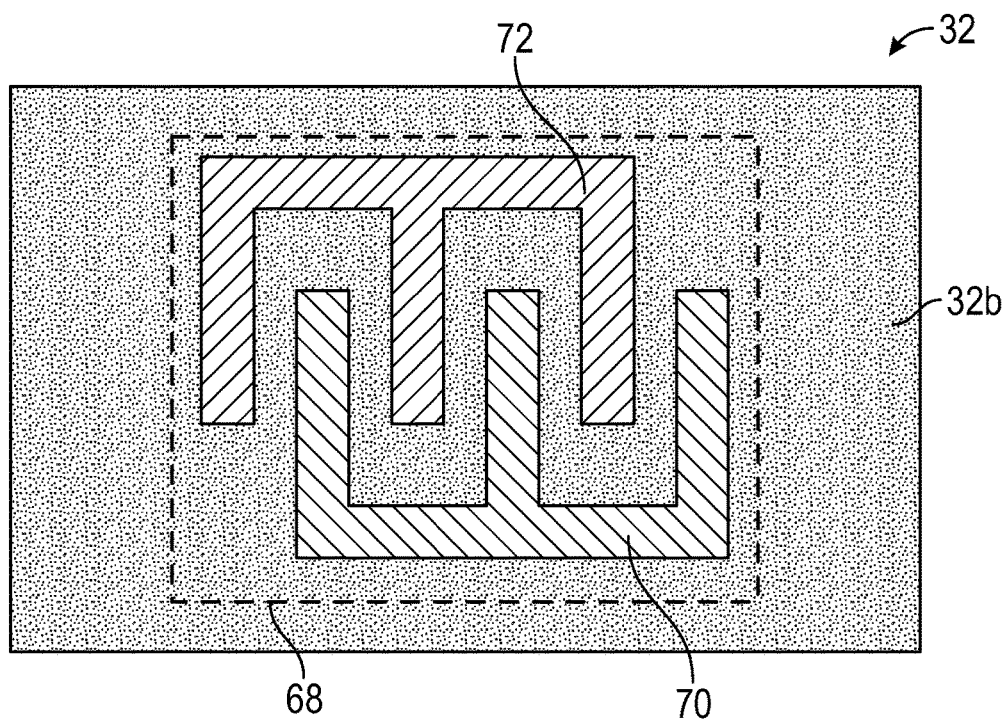
FIG. 12C

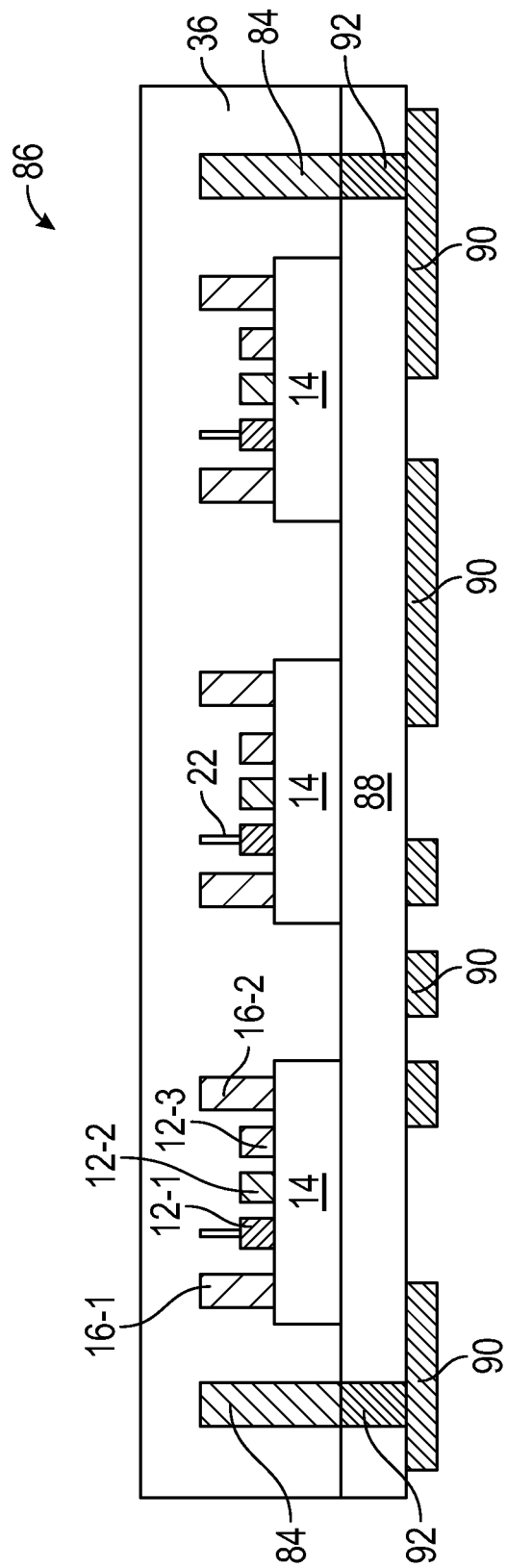
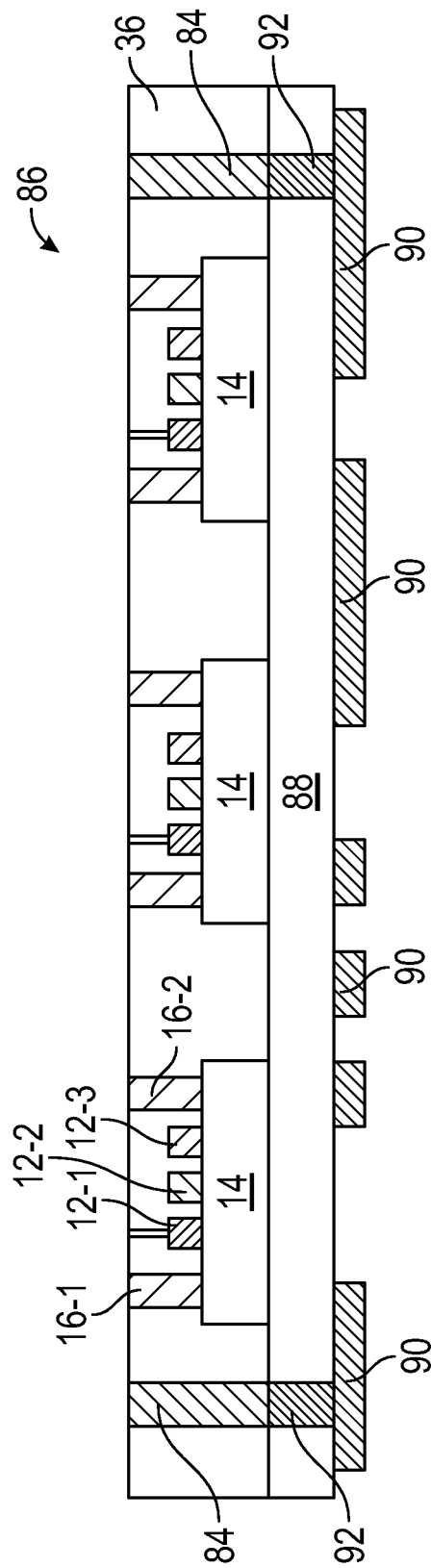
FIG. 16A
FIG. 16B

ACTIVE ELECTRICAL ELEMENTS WITH LIGHT-EMITTING DIODES

FIELD OF THE DISCLOSURE

The present disclosure relates to lighting devices including active electrical elements with light-emitting diodes.

BACKGROUND

Light-emitting diodes (LEDs) are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from epitaxial layers of silicon carbide, gallium nitride, aluminum gallium nitride, indium nitride, gallium phosphide, aluminum nitride, gallium arsenide-based materials, and/or from organic semiconductor materials.

LEDs have been widely adopted in various illumination contexts, for backlighting of liquid crystal display (LCD) systems (e.g., as a substitute for cold cathode fluorescent lamps), and for direct-view LED displays. Applications utilizing LED arrays include vehicular headlamps, roadway illumination, light fixtures, and various indoor, outdoor, and specialty contexts. Desirable characteristics of LED devices include high luminous efficacy, and long lifetime.

Conventional LCD systems require polarizers and color filters (e.g., red, green, and blue) that inherently reduce light utilization efficiency. Direct-view LED displays, which utilize self-emitting LEDs and dispense with the need for backlights, polarizers, and color filters, provide enhanced light utilization efficiency.

Large format multi-color direct-view LED displays (including full color LED video screens) typically include numerous individual LED panels, packages, and/or components providing image resolution determined by the distance between adjacent pixels or "pixel pitch." Direct-view LED displays include three-color displays with arrayed red, green, and blue (RGB) LEDs, and two-color displays with arrayed red and green (RG) LEDs. Other colors and combinations of colors may be used. For many LED display systems, it is desirable to form LED color groups for each pixel such as primary colors red, green, and blue (RGB) that define vertices of a triangle (or polygon) on a chromaticity diagram. This polygon defines the so-called color gamut of the display device, the area of which describes all the possible colors that the display device is capable of producing. Wider color gamut describes the capability of producing more colors than a display device having a narrower color gamut. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full-color pixel. Medium-sized displays with relatively smaller viewing distances require shorter pixel pitches (e.g., 3 mm or less), and may include panels with arrayed red, green, and blue LED components mounted on a single electronic device attached to a driver printed circuit board that controls the LEDs. Driver printed circuit boards are typically densely populated with electrical devices including capacitors, field effect transistors (FETs), decoders, microcontrollers, and the like for driving the pixels of the display. As pixel pitches continue to decrease for higher resolution displays, the density of such electrical devices scales higher corresponding to the increased number of pixels for a given panel area. This tends to add higher complexity and costs to LED panels for display applications as well as increase thermal crowding in areas where driver electronics are more closely spaced.

The art continues to seek improved LED array devices with small pixel pitches while overcoming limitations associated with conventional devices and production methods.

SUMMARY

The present disclosure relates to active electrical elements with light-emitting diodes (LEDs), and more particularly to active electrical elements with LEDs arranged thereon. One or more LEDs may be mounted on an active electrical element such that the one or more LEDs are within peripheral edges of the active electrical element. Contact pads may be arranged on the active electrical element for receiving external power and communication signals for active control of the one or more LEDs. A light-transmissive carrier may be positioned over the active electrical element and the one or more LEDs. Electrical traces on the carrier may be configured to electrically connect with the contact pads. Certain ones of the electrical traces may route external power connections and communication signals for the active electrical element. Others of the electrical traces may form a touch sensing element that is electrically coupled with the active electrical element. Multiple active electrical elements with LEDs provided thereon may arranged together to form an LED pixel array of an LED display. Each active electrical element may be configured to independently maintain and update driving conditions of each LED mounted thereon in response to control signals of the LED display. Arranging LEDs on active electrical elements according to the present disclosure provides compact sizes that are suitable to form active LED pixels configured for active-matrix addressing within an LED display or any other illumination or projection devices. Additionally, the present disclosure may be beneficial for single color LED devices, such as a blue LED with or without a lumiphoric material.

In one aspect, a light-emitting device comprising an active electrical element comprising: a first face and a second face that opposes the first face; and one or more contact pads on the first face that are configured to receive external electrical connections at a first plane that is above the first face; and at least one LED on the first face, the at least one LED comprising at least one anode or cathode contact that is electrically coupled with the active electrical element along a second plane that is closer to the first face than the first plane. In certain embodiments, the at least one anode or cathode contact is mounted to corresponding electrical traces that are on the first face of the active electrical element. The light-emitting device may further comprise a carrier on the active electrical element such that the at least one LED is between the carrier and the active electrical element. In certain embodiments, the carrier is light-transmissive to wavelengths of light generated by the at least one LED. In certain embodiments, the carrier comprises one or more electrical traces that are electrically coupled with the one or more contact pads at the first plane. In certain embodiments, the one or more electrical traces comprise a transparent conductor. In certain embodiments, the one or more electrical traces comprise indium tin oxide. In certain embodiments, the one or more electrical traces comprise at least one transparent conductor and at least one metal layer. In certain embodiments, the carrier comprises one or more electrical traces that form a capacitive touch sensor. The light-emitting device may further comprise one or more additional contact pads on the first face that are configured to receive at least one of a voltage sensing signal and a current sensing signal. In certain embodiments, the at least one of a voltage sensing signal and a current sensing signal comprises a touch sensing signal. In certain embodiments, a height of the at least one LED is less than a height of the one or more contact pads. In certain embodiments, the at least one LED comprises a plurality of LEDs that form an LED pixel on the first face of the active electrical element. In certain embodiments, the at least one LED comprises a plurality of LEDs that form a plurality of LED pixels on the first face of the active electrical element. In certain embodiments, the active electrical element is configured to receive a control signal and actively maintain an operating state of the at least one LED. In certain embodiments, the active electrical element comprises an application-specific integrated circuit.

In another aspect, a light-emitting device comprises: at least one LED; and an active electrical element electrically coupled to the at least one light-emitting diode, the active electrical element comprising a first face and a second face that opposes the first face, and one or more contact pads on the first face that are configured to receive at least one of a voltage sensing signal and a current sensing signal. In certain embodiments, the at least one of a voltage sensing signal and a current sensing signal comprises a touch sensing signal. In certain embodiments, the at least one LED is on the first face of the active electrical element. The light-emitting device may further comprise a carrier on the active electrical element such that the at least one LED is between the carrier and the active electrical element. In certain embodiments, the carrier is light-transmissive to wavelengths of light generated by the at least one LED. In certain embodiments, the carrier comprises one or more electrical traces that are electrically coupled with the one or more contact pads. In certain embodiments, the one or more electrical traces form a capacitive touch sensor. In certain embodiments, the one or more electrical traces comprise a first trace that is laterally surrounded by a second trace on a face of the carrier to form the capacitive touch sensor. In certain embodiments, the one or more electrical traces comprise a first trace that is separated from a second trace by an insulating layer to form the capacitive touch sensor. In certain embodiments, the first trace and the second trace form a grid array across an area of the carrier to form the capacitive touch sensor. In certain embodiments, the active electrical element comprises an application-specific integrated circuit.

In another aspect, a light-emitting device comprises: an active electrical element comprising a first face and a second face that opposes the first face, the active electrical element configured to provide a first function or a second function based on an arrangement of one or more redistribution layers at the first face, and the active electrical element configured to drive at least one LED in response to a received control signal. In certain embodiments, the at least one LED is on the first face of the active electrical element. In certain embodiments, the active electrical element further comprises one or more electronic layers that are configured to provide the first function and the second function. In certain embodiments, the one or more redistribution layers provide electrical connections to the one or more electronic layers to configure to the active electrical element for the first function or the second function. In certain embodiments, the first function comprises driving at least three LEDs. In certain embodiments, the second function comprises driving at least twelve LEDs. In certain embodiments, the second function comprises driving the at least one LED when the at least one LED is on the first face of the active electrical element. In certain embodiments, the second function comprises electrically coupling the active electrical element and the at least one LED in separate planes. In certain embodiments, the second function comprises combining outputs in parallel to form higher current outputs. In certain embodiments, the second function comprises reducing a number of contact pads of the active electrical element. In certain embodiments, the second function comprises activating less than all elements of the active electrical element. In certain embodiments, the second function comprises at least one of a voltage sensing signal or a current sensing signal. In certain embodiments, the active electrical element comprises an application-specific integrated circuit.

In another aspect, a light-emitting device comprises: an active electrical element comprising one or more contact pads that are configured to receive external electrical connections; at least one LED; a light-transmissive layer on the at least one LED; and an electrical trace between the light-transmissive layer and the LED, the electrical trace being electrically coupled to the active electrical element. In certain embodiments, the electrical trace is arranged along a same plane. In certain embodiments, the electrical trace forms at least a portion of a capacitor of a touch sensing element. In certain embodiments, the electrical trace forms at least a portion of a resistor of a touch sensing element.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 3A is a cross-sectional view of a light-emitting device before mounting with a carrier according to embodiments of the present disclosure.

FIG. 3B is a cross-sectional view of the light-emitting device of FIG. 3A and further including a carrier that is positioned for mounting over the LED chips and the active electrical element.

Figure 7:
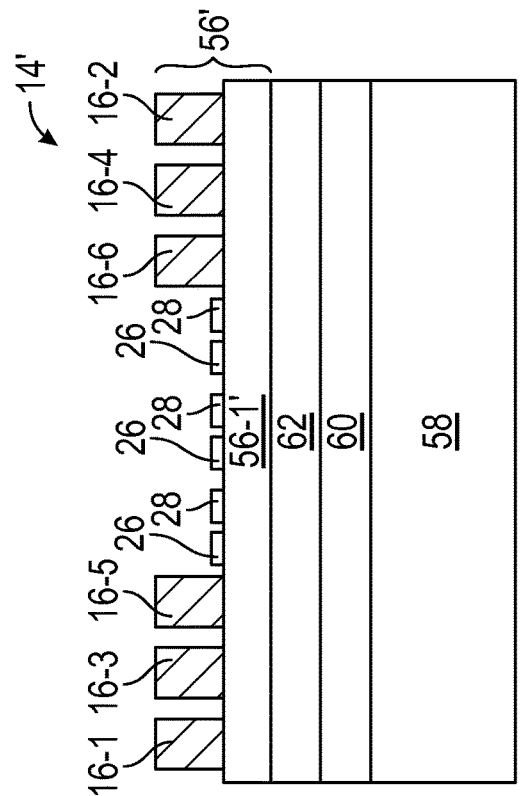
FIG. 7 is a cross-sectional view of a light-emitting device that includes an active electrical element configured with one or more redistribution layers that tailor the active electrical element to a particular application.
Figure 8:
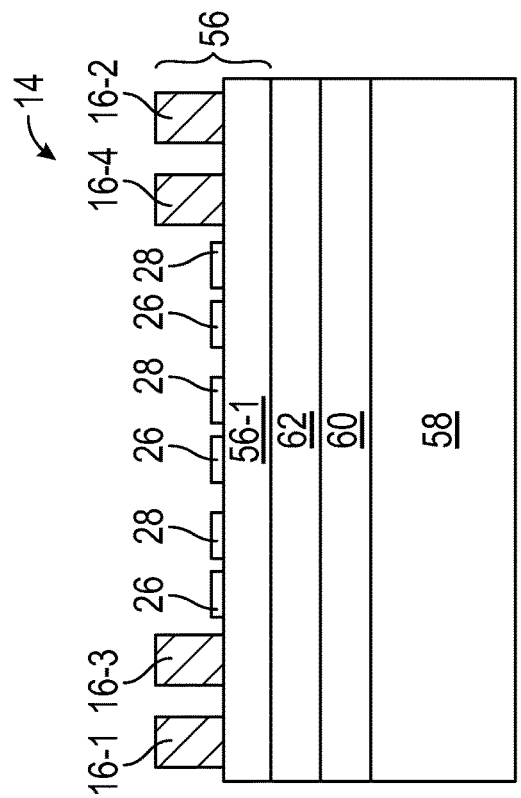

FIG. 8 a cross-sectional view of a light-emitting device that is similar to the light-emitting device of FIG. 7 and further includes a different configuration of one or more redistribution layers that tailor the active electrical element to a different application.

Figure 9:
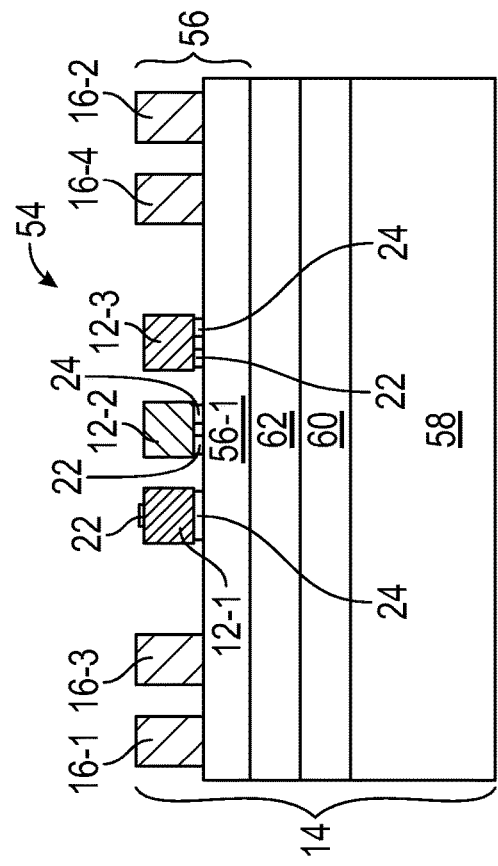

FIG. 9 is a cross-sectional view of a light-emitting device that includes the active electrical element of FIG. 7 and one or more LED chips mounted thereon.

Figure 10:
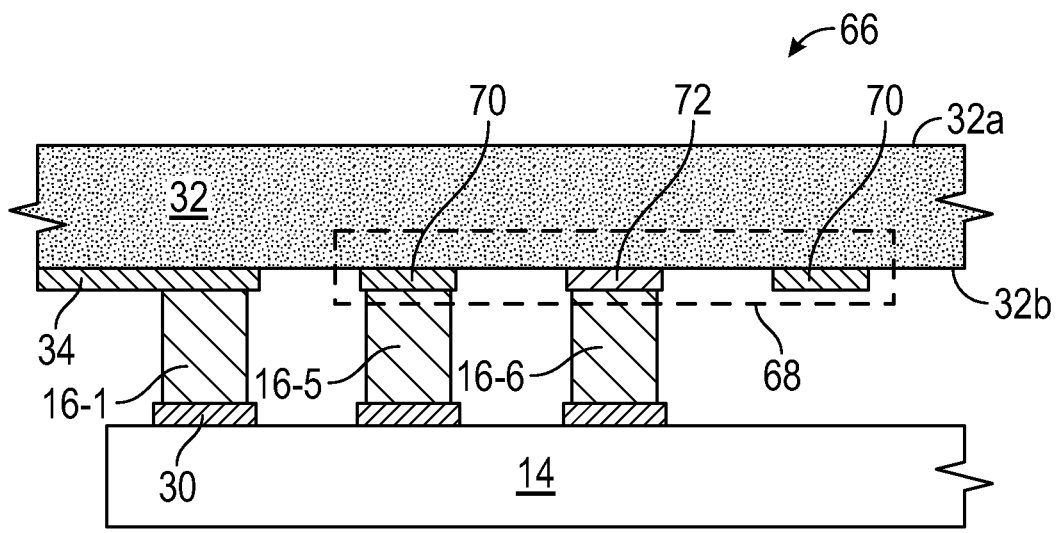

FIG. 10 is a cross-sectional view of a portion of a light-emitting device that is configured to receive at least one of a voltage sensing signal and a current sensing signal.

Figure 11A:
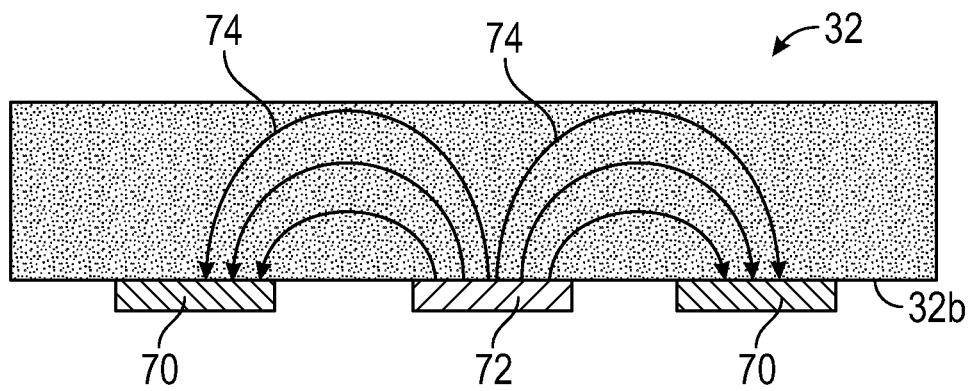
Figure 11B:
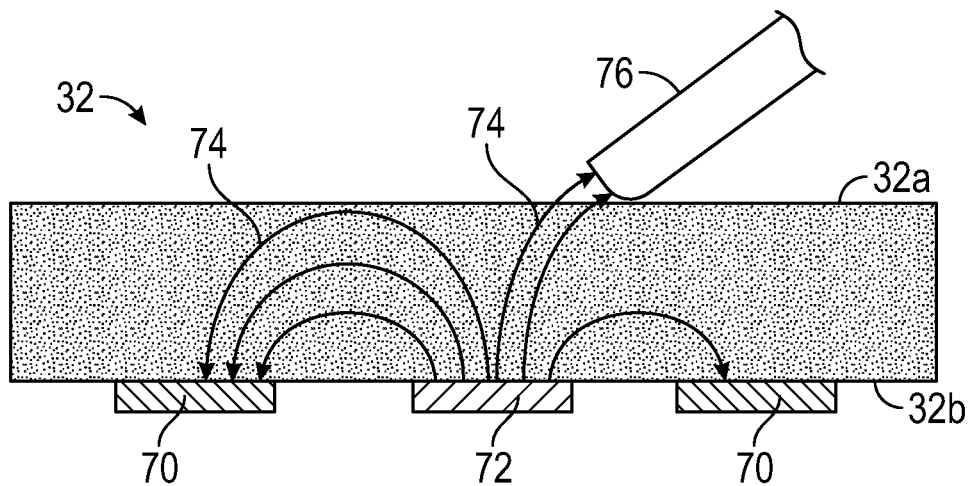

FIG. 11A and FIG. 11B are cross-sectional views of a portion of a carrier that includes a capacitive touch element and further illustrate behavior of an electrical field from the capacitive touch element with and without interaction from a conductor.

FIG. 12A illustrates a configuration of a capacitive touch element that forms a square or rectangular shape according to embodiments of the present disclosure.

FIG. 12B illustrates a configuration of a capacitive touch element that forms a circular shape according to embodiments of the present disclosure.

FIG. 12C illustrates a configuration of a capacitive touch element that forms an interlocking comb pattern according to embodiments of the present disclosure.

Figure 13A:
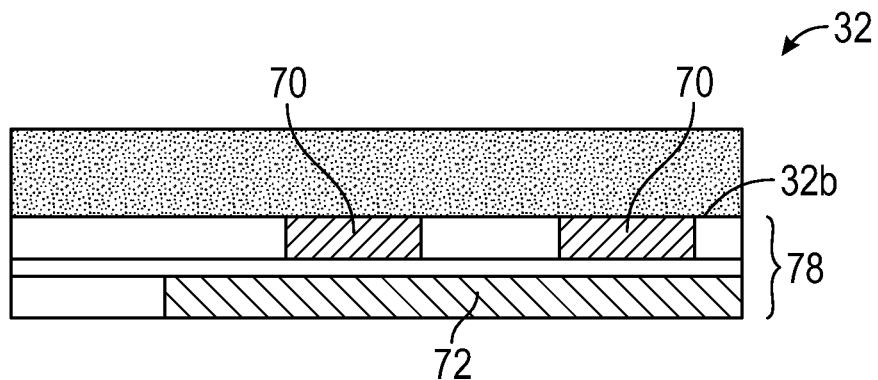

FIG. 13A is a cross-sectional view of a carrier that includes a capacitive touch element with different electrical traces provided on different horizontal layers.

Figure 13B:
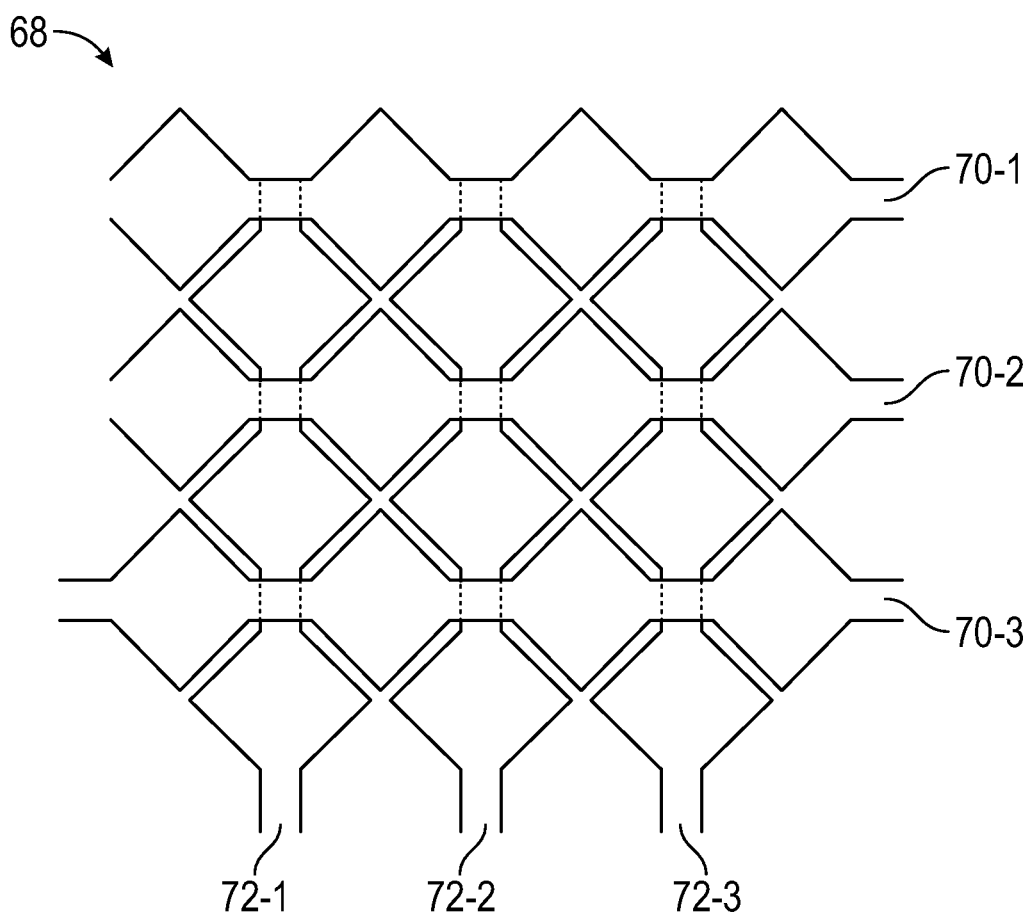

FIG. 13B is a bottom view of the carrier of FIG. 13A illustrating the capacitive touch element in a grid array for fine resolution touch sensing.

Figure 14A:
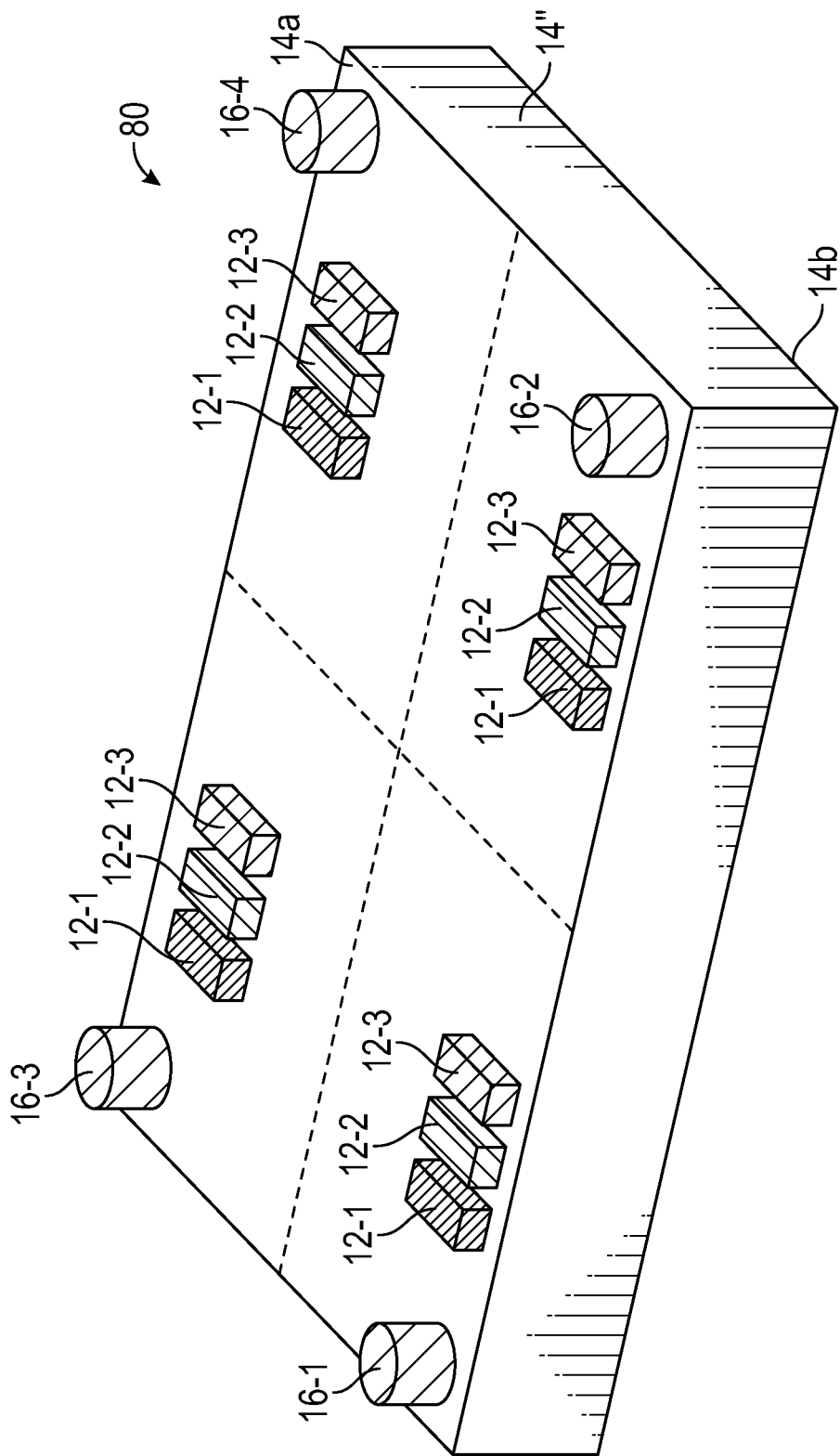

FIG. 14A is a perspective view of a light-emitting device where multiple groups of LED chips form an array of LED pixels that are arranged on and electrically coupled to a common active electrical element.

Figure 14B:
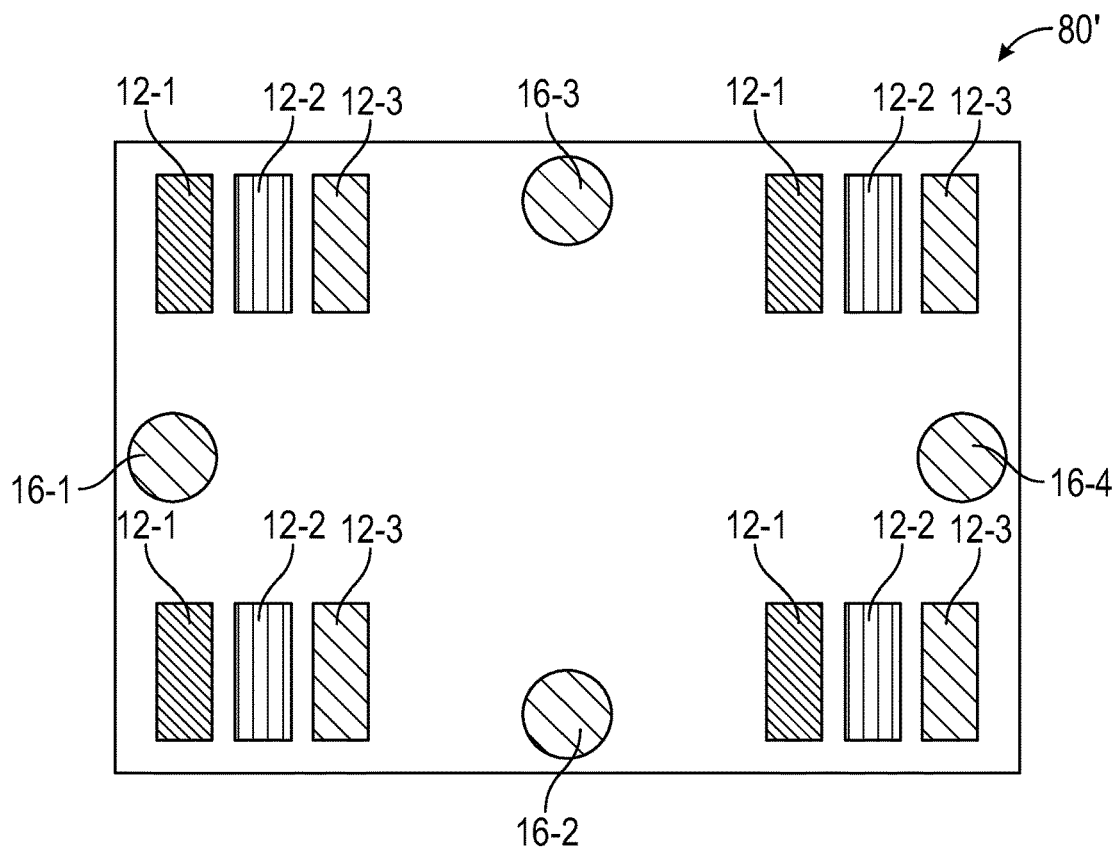
Figure 14C:
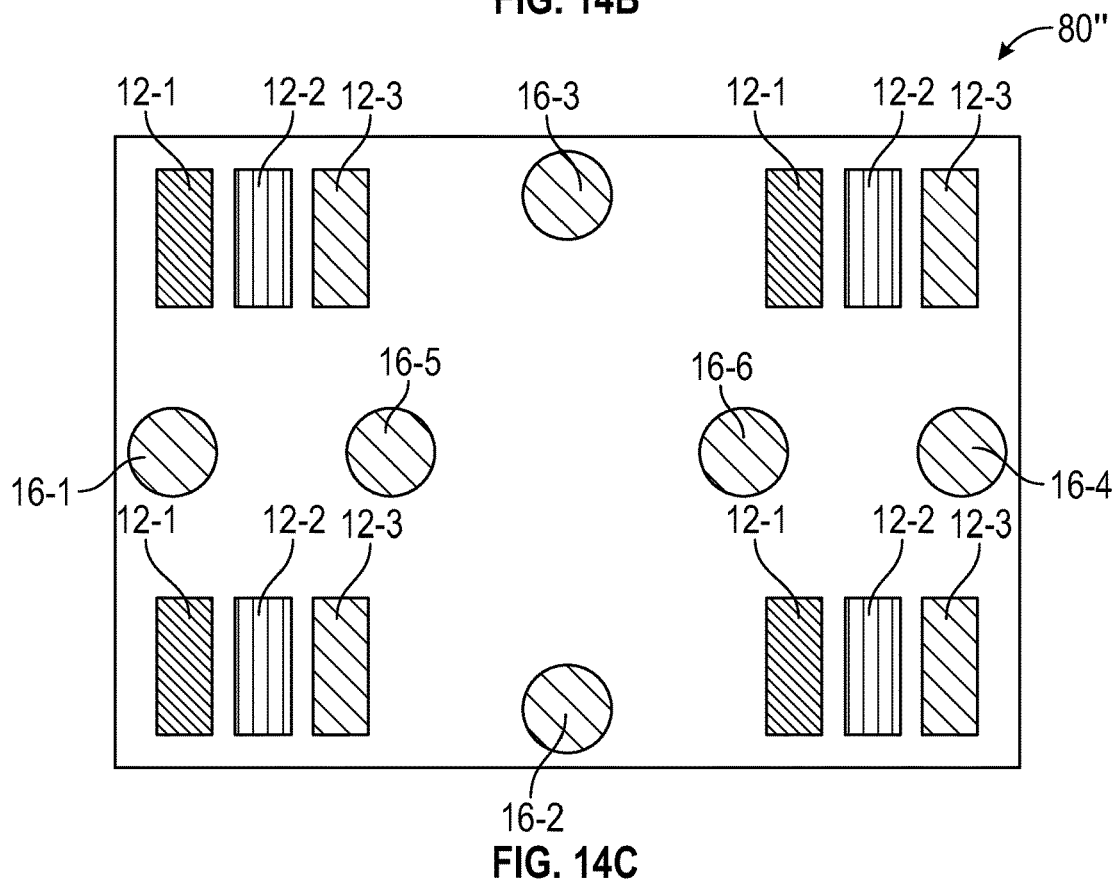

FIG. 14B and FIG. 14C are respective top views of the light-emitting device of FIG. 14A with alternative layouts of LED chips and contact pads.

Figure 15:
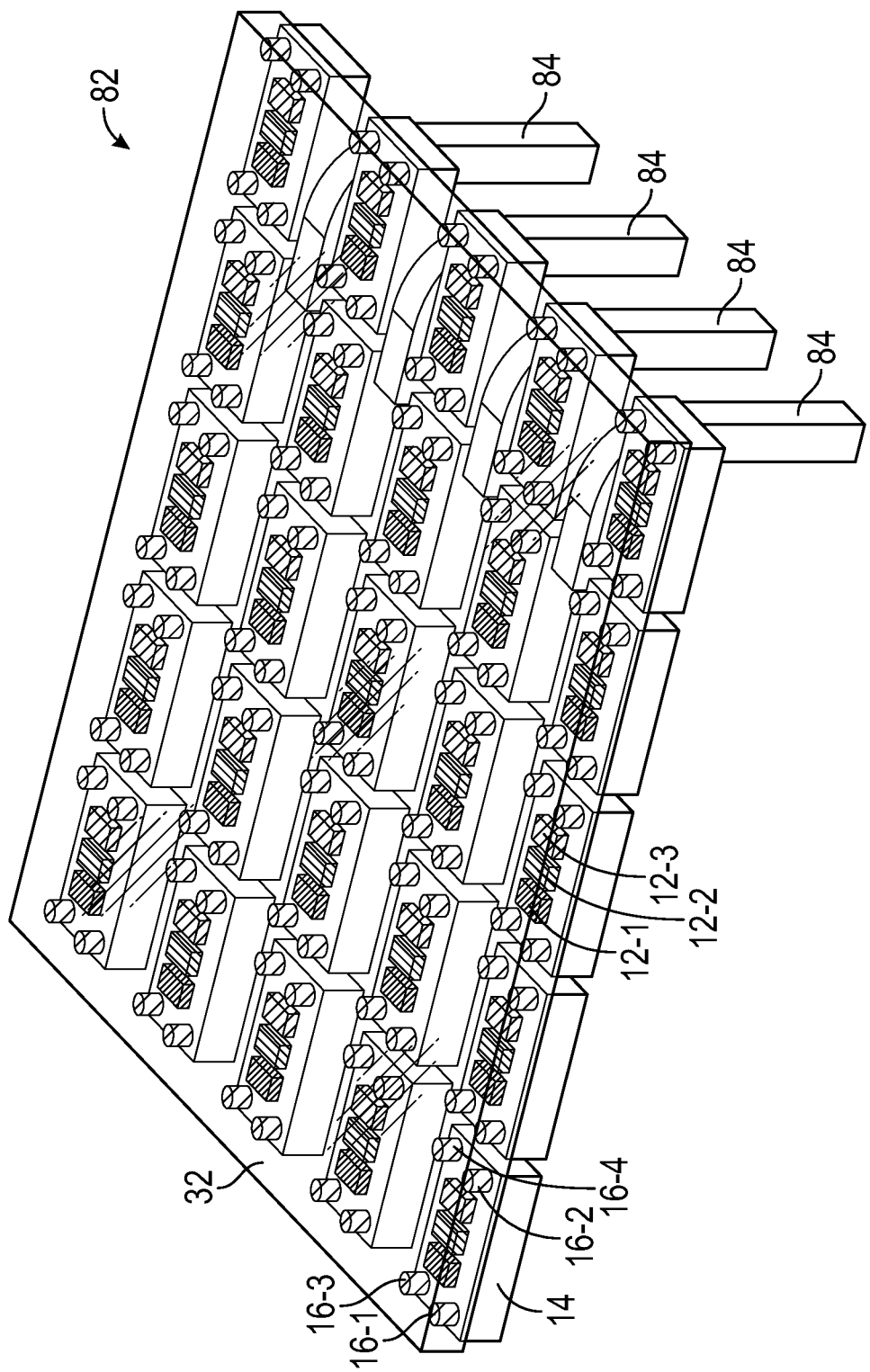

FIG. 15 is a top perspective view of a portion of a light-emitting device that includes multiple active electrical elements having LED chips that form an LED pixel array.

FIG. 16A is a cross-sectional view of a light-emitting device according to embodiments where one or more active electrical elements with LED chips are arranged on a substrate panel.

FIG. 16B is a cross-sectional view of the light-emitting device of FIG. 16A after thinning of an encapsulant.

Figure 16C:
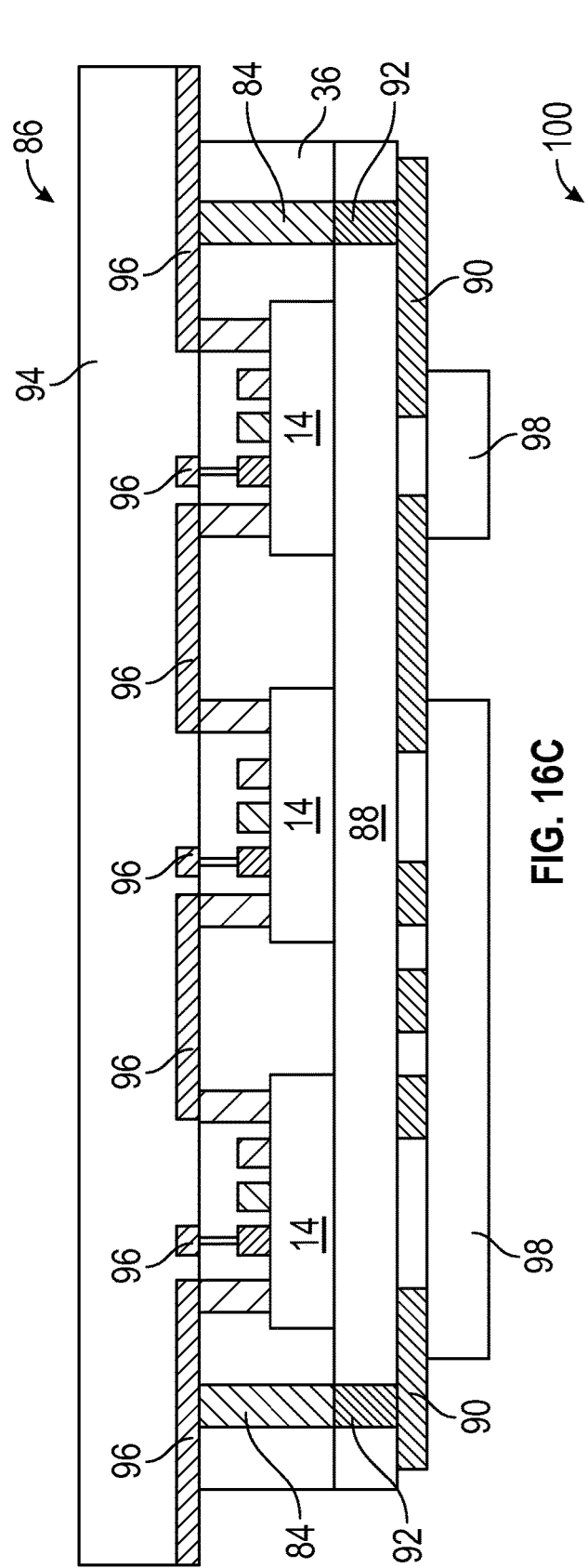

FIG. 16C is a cross-sectional view of the light-emitting device of FIG. 16B after a light-transmissive layer is arranged on the encapsulant.

Figure 17:
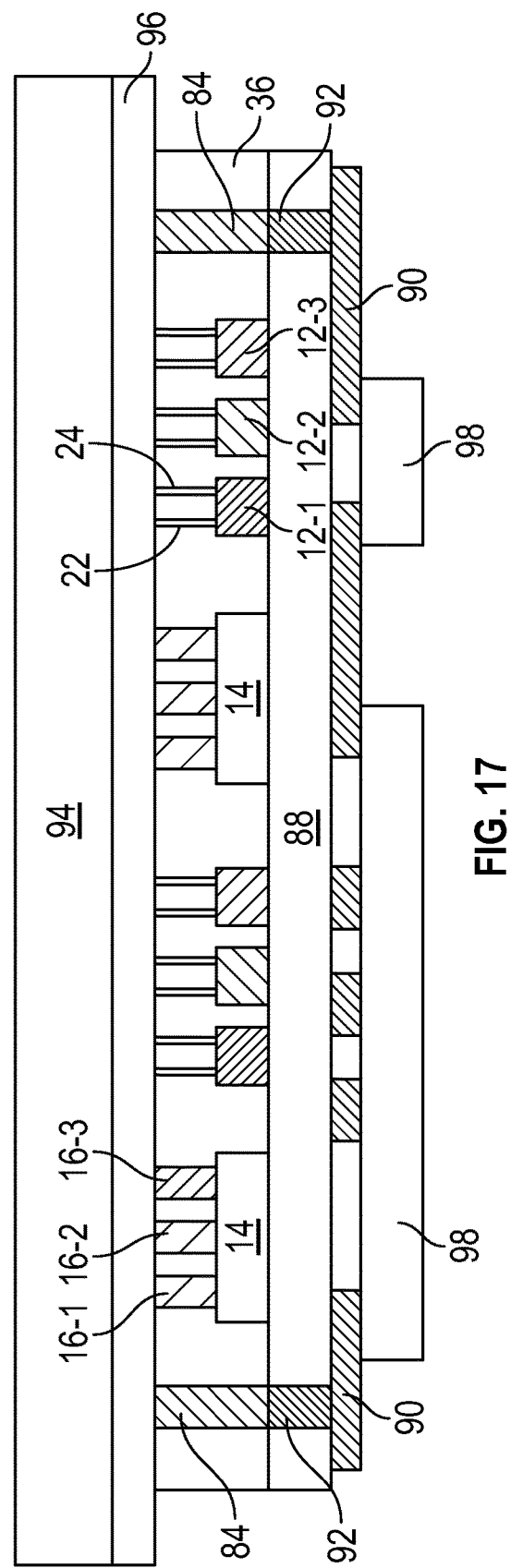

FIG. 17 is a cross-sectional view of a light-emitting device that is similar to the light-emitting device of FIGS. 16A-16C, except the LED chips are arranged outside or apart from the active electrical elements.

Figure 18:
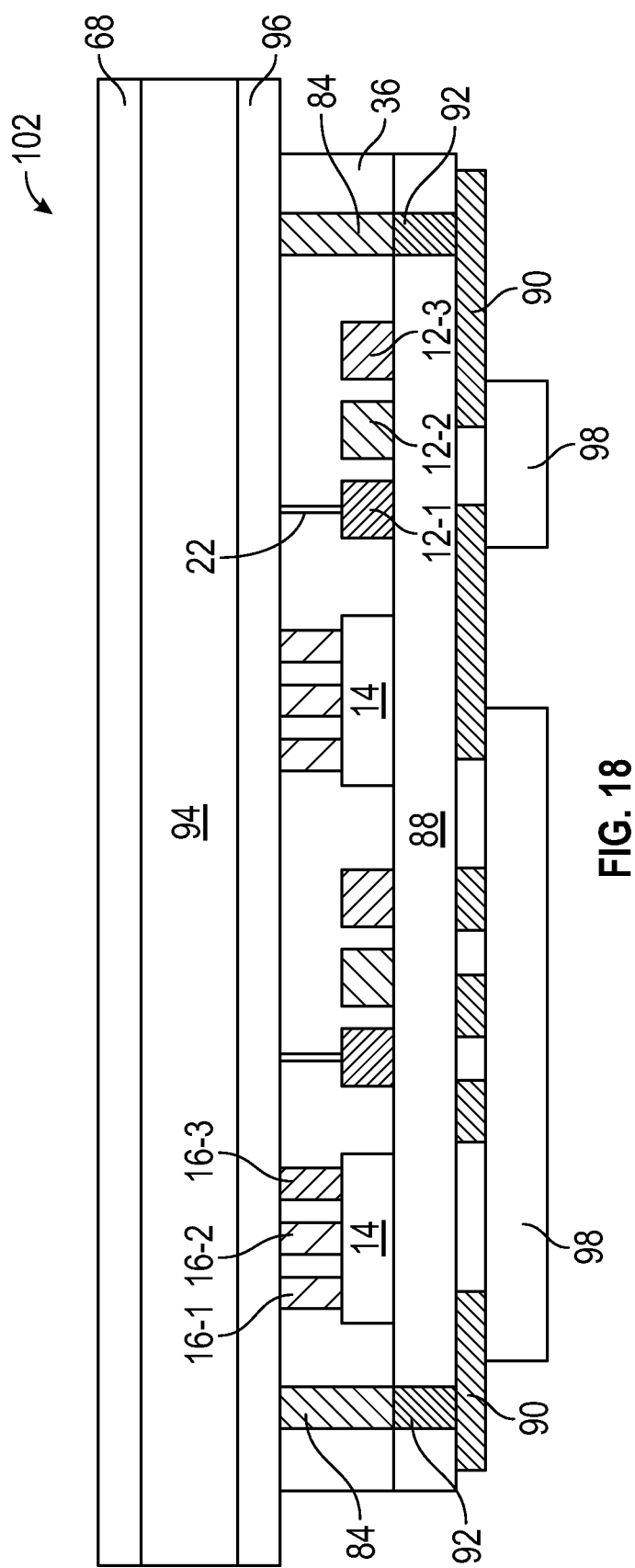

FIG. 18 is a cross-sectional view of a light-emitting device that is similar to the light-emitting device of FIG. 17 and further includes a touch sensing element.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to active electrical elements with light-emitting diodes (LEDs), and more particularly to active electrical elements with LEDs arranged thereon. One or more LEDs may be mounted on an active electrical element such that the one or more LEDs are within peripheral edges of the active electrical element. Contact pads may be arranged on the active electrical element for receiving external power and communication signals for active control of the one or more LEDs. A light-transmissive carrier may be positioned over the active electrical element and the one or more LEDs. Electrical traces on the carrier may be configured to electrically connect with the contact pads. Certain ones of the electrical traces may route external power connections and communication signals for the active electrical element. Others of the electrical traces may form a touch sensing element that is electrically coupled with the active electrical element. Multiple active electrical elements with LEDs provided thereon may arranged together to form an LED pixel array of an LED display. Each active electrical element may be configured to independently maintain and update driving conditions of each LED mounted thereon in response to control signals of the LED display. Arranging LEDs on active electrical elements according to the present disclosure provides compact sizes that are suitable to form active LED pixels configured for active-matrix addressing within an LED display or any other illumination or projection devices. Additionally, the present disclosure may be beneficial for single color LED devices, such as a blue LED with or without a lumiphoric material.

The present disclosure relates to light-emitting devices including LEDs, LED packages, and related LED displays, and more particularly to active control of LEDs within LED displays. LED displays may include rows and columns of LEDs that form an array of LED pixels. A particular LED pixel may include a cluster of LED chips of the same color or multiple colors, with an exemplary LED pixel including a red LED chip, a green LED chip, and a blue LED chip. In certain embodiments, an LED device includes a plurality of LED chips that form at least one LED pixel and a plurality of such LED devices may be arranged to form an array of LED pixels for an LED display. Each LED device may include an active electrical element that is configured to receive a control signal and actively maintain an operating state, such as brightness or grey level, or a color select signal for the LED chips of the LED device while other LED devices are being addressed. In certain embodiments, the active electrical element may include active circuitry that includes one or more of a driver device, a signal conditioning or transformation device, a memory device, a decoder device, an electrostatic discharge (ESD) protection device, a thermal management device, and a detection device, among others. In this regard, each LED pixel of an LED display may be configured for operation with active matrix addressing. The active electrical element may be configured to receive one or more of an analog control signal, an encoded analog control signal, a digital control signal, and an encoded digital control signal.

According to embodiments of the present disclosure, arrangements of LED chips on active electrical elements are provided, thereby providing LED chips in close proximity with corresponding active electrical elements within a larger LED array. In this manner, individual LED pixels of a larger display may be configured for operation with appropriate communication signals, including but not limited to active matrix addressing. Further details regarding active control of LEDs and corresponding LED pixels are disclosed in U.S. Patent Application Publication No. 2020/0312231 A1, titled "Active Control of Light-emitting Diodes and Light-emitting Diode Displays," with the entire contents thereof being hereby incorporated by reference herein.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, un-doped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red light with a peak wavelength range of 600 nm to 650 nm. The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer may be arranged between the metal reflector layer and first and second electrical contacts, wherein the first electrical contact is arranged in conductive electrical communication with a first semiconductor layer, and the second electrical contact is arranged in conductive electrical communication with a second semiconductor layer. In some embodiments, the first and second electrical contacts themselves may be configured as mirror layers. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in some embodiments high reflectivity; and/or a desired, and in some embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides of the LED chip. A lateral geometry LED chip typically includes both anode and cathode connections on the same side of the LED chip that is opposite a substrate, such as a growth substrate. Certain embodiments disclosed herein relate to the use of flip chip LED devices in which a light transmissive substrate represents an exposed light-emitting surface.

LED chips or LED packages that include one or more LED chips can be arranged in many different applications to provide illumination of objects, surfaces, or areas. In certain applications, clusters of differently colored LED chips or LED packages may be arranged as pixels for LED display applications, including video displays. For example, individual clusters of red, green, and blue LED chips may form LED pixels of a larger LED display. In certain applications, the red, green, and blue LED chips of each pixel may be packaged together as a multiple-LED package and the LED display is formed when arrays of such multiple-LED packages are arranged together. In this regard, each pixel may include a single LED package that includes a red LED chip, a green LED chip, and a blue LED chip. In other embodiments, the red, green, and blue LED chips may be separately packaged or arranged in a chip-on-board configuration. In certain LED display applications, arrays of LED pixels are arranged on panels, which may also be referred to as tiles or LED modules, and arrays of such panels are arranged together to form larger LED displays. Depending on the application, each panel of an LED display may include different numbers of LED pixels. In certain applications, each panel of an LED display may include an array formed by 64 rows by 64 columns of LED pixels or more. In certain embodiments, each panel of an LED display may be configured with a horizontal display resolution of about 4,000 LED pixels, or 4K resolution. For applications where higher screen resolution is desired for LED displays, each panel may include even more rows and columns of LED pixels that are more closely spaced to one another. Depending on the desired screen resolution, pixel pitches may be about 3 millimeters (mm), or about 2.5 mm, or about 1.6 mm, or in a range from about 1.5 mm to about 3 mm, or in a range from about 1.6 mm to about 3 mm, or in a range from about 1.5 mm to about 2.5 mm. Additionally, for fine pitch LED displays with even higher screen resolutions, pixel pitches may be configured to be less than 1 mm, or less than 0.8 mm, or in a range from about 0.5 mm to about 1 mm, or about 0.7 mm for certain embodiments.

In conventional video display applications, the LED pixels are typically configured for passive matrix addressing. In this regard, the LED pixels may be arranged for coupling to a passive interface element that provides electrical connections to a separate driver or controller. For example, orthogonally arranged (e.g., vertical and horizontal) conductors form rows and columns in a grid pattern, whereby individual LED chips of each LED pixel are defined by each intersection of a row and column. Multiplex sequencing may be used to permit individual control of each LED chip of the array while employing a smaller number of conductors than the number of LED chips in the array, either by utilizing a common-row anode or common-row cathode matrix arrangement, and brightness control may be provided by pulse width modulation (PWM). In this manner, conductors for rows or columns are shared among many LED pixels and time division multiplexing is employed to address each individual LED pixel. Due to their passive configuration, each LED pixel only emits light within their respective communication times. The separate drivers for controlling the display are typically arranged remotely from the pixels of the display, such as on a separate board or module, or on a printed circuit board (PCB) that is attached or otherwise mounted to the backside of each panel, or on the backside of a common PCB that includes an array of pixels on the frontside. As previously, described, the PCBs are typically densely populated with electrical devices including capacitors, field effect transistors (FETs), decoders, microcontrollers, and the like for driving each of the pixels on a particular panel. For higher resolution displays, the density of such electrical devices scales higher corresponding to the increased number of pixels on each panel. As previously described, this can add higher complexity and costs to LED panels for display applications as well as increase thermal crowding in areas where driver electronics are more closely spaced. For passive matrix addressing, the LED pixels are typically driven by pulsed signal sequences. In this regard, the LED pixels may pulse rapidly at certain frequencies, such as 60 hertz (Hz) or 120 Hz depending on the display scan rate. While the video display may not appear to be rapidly pulsing to a human eye, it may be detectable with image capture equipment, and in some instances, interference beating can be present between the video display and other pulsed displays or light sources that are in proximity with the video display.

According to embodiments disclosed herein, each LED pixel of an LED display may be configured for operation with active matrix addressing. For active matrix addressing, each LED pixel is configured to actively maintain an operating or driving state, such as brightness or grey level, or color select, while other LED pixels are being addressed, thereby allowing each LED pixel to maintain their driving state with either reduced pulsing or no pulsing depending on the driving configuration. Accordingly, each LED pixel may be configured to hold its respective operating state with a continuous drive signal, rather than by time division multiplexed signals that result in low frequency pulses associated with passive matrix addressing. In this regard, each LED pixel may include an active electrical chip or an active electrical element that may include a memory device and the ability to alter a driving condition or drive condition of the LED pixel based on a memory from the memory device. In certain embodiments, the continuous drive signal is a constant analog drive current, and in other embodiments where the brightness level may be controlled by pulsed methods such as PWM, the continuous drive signal may refer to a PWM signal that is not interrupted by the time division multiplexed scanning of other LED pixels within the array or within a sub-array. In certain embodiments, the active electrical element may include active circuitry that includes one or more of a driver device, a signal conditioning or transformation device, a memory device, a decoder device, an ESD protection device, a thermal management device, a detection device, and a voltage and/or current sensing device and circuitry, among others. In various embodiments, an active electrical element comprises an integrated circuit chip, an application-specific integrated circuit (ASIC), a microcontroller, or a field-programmable gate array (FPGA). In certain embodiments, active electrical elements may be configured to be programmable or reprogrammable after they are manufactured through various memory elements and logic that are incorporated within the active electrical elements.

As used herein, the term "active electrical chip," "active electrical element," or "active electrical component" includes any chip or component that is able to alter a driving condition of an LED based on memory or other information that may be stored within a chip or component. As used herein, the terms "active LED pixel" and "smart LED pixel" may be used interchangeably and may refer to a device that includes one or more LED devices or chips that form a pixel and an active electrical element or chip as described above. In certain embodiments, each LED pixel may comprise a single LED package that is configured as an active LED package that includes multiple LED chips and an active electrical element as described above. In this manner, the number of separate electrical devices needed for the LED display may be reduced, such as the separate electrical devices located on the backsides of LED panels of the LED display as previously described. Additionally, overall operating powers needed to run the LED panels may be reduced.

Figure 1:
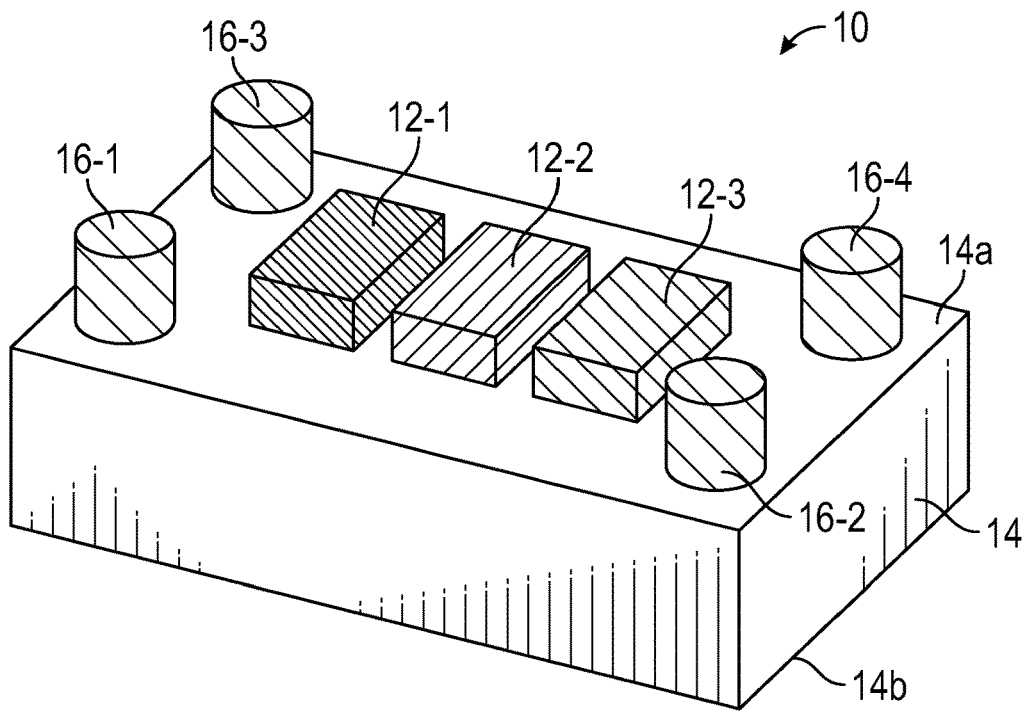
FIG. 1 is a perspective view of a lighting-emitting device that includes one or more light-emitting diode (LED) chips on an active electrical element to form an active LED pixel according to embodiments of the present disclosure.

FIG. 1 is a perspective view of a lighting-emitting device 10 that includes one or more LED chips 12-1 to 12-3 on an active electrical element 14 to form an active LED pixel according to embodiments of the present disclosure. The active electrical element 14 includes a first face 14*a* and a second face 14*b* that opposes the first face 14*a*. Depending on the orientation, the first face 14*a* may be referred to as a topside of the active electrical element 14 and the second face 14*b* may be referred to as a bottom side of the active electrical element 14. In certain embodiments, the LED chips 12-1 to 12-3 are mounted and electrically coupled to the active electrical element 14 on the first face 14*a*. In this regard, the LED chips 12-1 to 12-3 are arranged within peripheral boundaries or edges of the active electrical element 14, thereby providing the light-emitting device 10 with a compact size that is suitable for use as an active LED pixel for an LED display, among other applications. The active electrical element 14 further includes a number of contact pads 16-1 to 16-4 that are configured to receive external electrical connections for the light-emitting device 10. In certain embodiments, the contact pads 16-1 to 16-4 are configured to receive one or more external electrical and/or control signals for the active electrical element 14 to control the LED chips 12-1 to 12-3, such as various combinations of input signals or connections including a supply voltage, a ground, color select signals, brightness level (or grey level) signals, analog signals, encoded color select signals, encoded brightness level select signals, digital signals, clock signals, and asynchronous data signals. For an LED display application, a control element for the LED display may be configured to output the various electrical and/or control signals that are received by each active LED pixel (e.g., the light-emitting device 10). In various applications, the control element may include an integrated circuit, such as one or more of an ASIC, a microcontroller, a programmable control element, and an FPGA.

In certain embodiments, the one or more LED chips 12-1 to 12-3 comprise individual LED chips that generate different dominant wavelengths of light. For example, the LED chip 12-1 may be configured to generate predominantly red emissions, the LED chip 12-2 may be configured to generate predominantly green emissions, and the LED chip 12-3 may be configured to generate predominantly blue emissions. Accordingly, the one or more LED chips 12-1 to 12-3 may comprise a red LED chip, a green LED chip, and a blue LED chip. In other embodiments, different combinations of colors and numbers of LEDs are possible. In still further embodiments, each of the LED chips 12-1 to 12-3 may be configured to generate light emissions that are predominantly the same as one another. In other embodiments, the LED chips 12-1 to 12-3 may comprise a micro-LED structure where a common active LED structure is segregated into a plurality of active LED structure portions to form the LED chips 12-1 to 12-3 that may be independently addressable from one another.

The active electrical element 14 is configured to receive the one or more external electrical and/or control signals and independently drive each LED of the one or more LED chips 12-1 to 12-3. In certain embodiments, the active electrical element 14 includes a memory element, chip, or component that is configured to store one or more operating states for the LED chips 12-1 to 12-3. The active electrical element 14 may further be configured to alter one or more driving conditions of the LED chips 12-1 to 12-3 based on the one or more stored operating states. In certain embodiments, the active electrical element 14 is configured to independently alter a driving condition of each of the LED chips 12-1 to 12-3 based on a plurality of operating states that are stored by the memory element. In this regard, the active electrical element 14 may be configured to receive and store one or more operating states, and independently drive each LED of the LED chips 12-1 to 12-3 according to the one or more operating states. The active electrical element 14 may continue to drive and maintain the operating state for each LED of the LED chips 12-1 to 12-3 until the active electrical element 14 receives refreshed or updated signals that correspond to updated operating states. In this manner, the active electrical element 14 may be configured to alter a driving condition of the LED chips 12-1 to 12-3 in accordance with a temporarily stored operating state of the memory element. Accordingly, the LED chips 12-1 to 12-3 may be configured for active matrix addressing as previously described. In order to rapidly receive one or more operating states for the LED chips 12-1 to 12-3, the contact pads 16-1 to 16-4 may be configured to receive one or more signals and corresponding electrical connections within the active electrical element 14 may be configured to send signals to independently drive or address the LED chips 12-1 to 12-3. In certain embodiments, the active electrical element 14 comprises one or more of an integrated circuit chip, an ASIC, a microcontroller, or a FPGA. As previously described, the active electrical element 14 may be configured to be programmable or reprogrammable after it is manufactured through various memory elements and logic that are incorporated within the active electrical element 14. In this regard, the active electrical element 14 may be considered programmable for embodiments where the active electrical element 14 does not include a FPGA.

Figure 2:
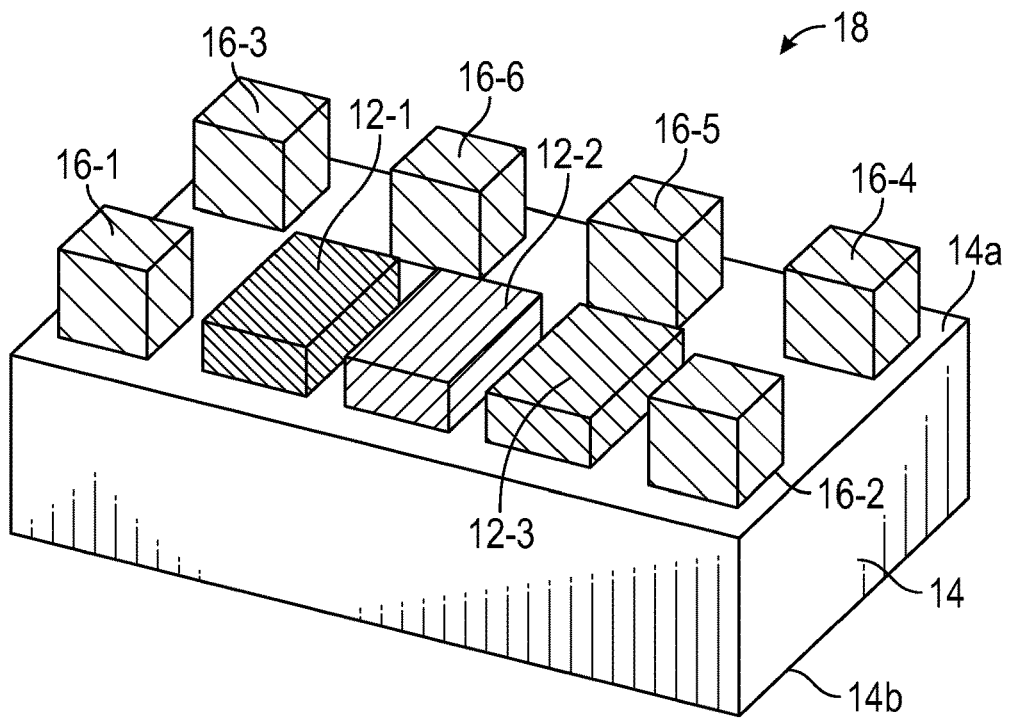
FIG. 2 is a perspective view of a light-emitting device that is similar to the light-emitting device of FIG. 1 and further includes one or more additional contact pads that are configured for sensing applications.

FIG. 2 is a perspective view of a light-emitting device 18 that is similar to the light-emitting device 10 of FIG. 1 and further includes one or more additional contact pads 16-5, 16-6 that are configured for sensing applications. While the contact pads 16-1 to 16-4 may be configured in a similar manner as described for the light-emitting device 10 of FIG. 1, the additional contact pads 16-5, 16-6 may be configured for other purposes, such as providing connections for the active electrical element 14 to receive one or more sensing signals. In certain embodiments, the sensing signals may include at least one of a voltage sensing signal and a current sensing signal. For example, the light-emitting device 18 may be configured for touch sensing such as capacitive or resistive touch sensing within an LED display. In this regard, the additional contact pads 16-5, 16-6 may form part of a touch sensor. In other embodiments, the additional contact pads 16-5, 16-6 may be configured to receive signals from one or more of an ambient light sensor, a proximity or motion sensor, a video sensor, or an environmental sensor such as a temperature, pressure, humidity, or Geiger counter sensor. In this regard, the additional contact pads 16-5, 16-6 may be configured to provide electrical connections for any time and/or frequency domain or sensing signals including other types of communication signals. While two additional contact pads 16-5, 16-6 are illustrated in FIG. 2, any number of additional contact pads 16-5, 16-6 may be provided depending on the application.

As illustrated above, the light-emitting devices 10, 18 may be formed with a compact size by arranging the LED chips 12-1 to 12-3 within peripheral edges of the active electrical element 14. In this regard, overall dimensions of the light-emitting devices 10, 18 may be formed with compact sizes that may be scaled according to LED chip dimensions. For example, exemplary LED chip sizes may include length and width dimensions of 200 microns (μm) by 130 μm, or 150 μm by 130 μm, or 40 μm by 30 μm for micro-LED chips. In this regard, the light-emitting devices 10, 18 may comprise corresponding length and width dimensions as small as 400 μm by 200 μm, or 300 μm by 200 μm to allow a layout of the LED chips 12-1 to 12-3 and the contact pads 16-1 to 16-6. In this regard, the principles disclosed herein provide the light-emitting devices 10, 18 with compact sizes for use as LED pixels that are configured for active-matrix addressing within larger LED displays.

Light-emitting devices of the present disclosure, such as the light-emitting devices 10, 18 respectively of FIG. 1 and FIG. 2, may be provided in pixel arrays of an LED display. In this regard, such light-emitting devices may be arranged together on a common carrier to form the pixel arrays. In certain embodiments, one or more light-emitting devices of the present disclosure may be mounted or otherwise supported by a carrier such that the LED chips of each light-emitting device are arranged between the carrier and the active electrical elements of each light-emitting device. In this regard, the LED chips may be oriented to provide light emissions that pass through the carrier to form a primary emission face of the LED display. In various applications, the carrier may also be referred to as one or more of a panel, a carrier panel, a submount, and a superstrate. The carrier may be configured as light-transmissive or light-transparent to wavelengths of light emitted by the LED chips and may comprise many different materials with a preferred material being electrically insulating. Suitable materials include, but are not limited to glass, sapphire, epoxy, silicone, various organic polymers and/or hybrid organic polymers, and ceramic materials such as aluminum oxide or alumina. In certain embodiments where the carrier is light-transmissive, the carrier may be referred to as a superstrate. The term "superstrate" is used herein, in part, to avoid confusion with other substrates that may be part of the semiconductor light-emitting device, such as a growth or carrier substrate of an LED chip or a different submount for a packaged LED. The term "superstrate" is not intended to limit the orientation, location, and/or composition of the structure it describes.

FIG. 3A is a cross-sectional view of a light-emitting device 20 before mounting with a carrier according to embodiments of the present disclosure. The light-emitting device 20 may be configured similar to either the light-emitting device 10 of FIG. 1 of the light-emitting device 18 of FIG. 2. In this regard, the LED chips 12-1 to 12-3 are mounted on the first face 14a of the active electrical element 14. Depending on the configuration, one or more of the LED chips 12-1 to 12-3 may comprise an anode contact 22 and a cathode contact 24 that are laterally arranged such that one or more of the LED chips 12-1 to 12-3 may be flip-chip mounted on the active electrical element 14. The active electrical element 14 comprises a number of electrical traces (labeled as 26, 28, and 30) that are arranged on the first face 14a. In this regard, the anode contact 22 and the cathode contact 24 of each LED chip 12-1 to 12-3 may be electrically coupled with corresponding pairs of electrical traces 26, 28. The contact pads 16-1, 16-2 may be electrically coupled with corresponding electrical traces 30 that are laterally spaced on the first face 14a from the other electrical traces 26, 28. The electrical traces 26, 28, 30 provide electrical connections with various portions of the circuitry within the active electrical element 14. The active electrical element 14 may include many layers that are understood to be part of the active electrical element 14 as illustrated. In particular, many layers and sublayers may be arranged at or near the first face 14a that facilitate electrical routing within the active electrical element 14. For illustrative purposes, only the electrical traces 26, 28, 30 are shown even as some layers may yet interpose the adjoining contacts. For example, passivation materials can cover portions of the anode contact 22, interposing portions of the anode contact 22 and the corresponding electrical trace 26. There can be passivation materials covering portions of the electrical trace 26 on the active electrical element 14 as well. In various configurations, the contact pads 16-1, 16-2 may also be considered part of the active electrical element 14.

As illustrated in FIG. 3A, the contact pads 16-1, 16-2 may be arranged at a first height H1 and at least one of the LED chips 12-1 to 12-3 may be arranged at a second height H2 where both heights H1, H2 are measured in a perpendicular direction from the first face 14a. In certain embodiments, the first height H1 may be greater than the second height H2 such that the contact pads 16-1, 16-2 may be more easily mounted to another surface without disturbing the LED chips 12-1 to 12-3. In further embodiments, the first height H1 of the contact pads 16-1, 16-2 may be greater than the second height H2 of all of the LED chips 12-1 to 12-3. In other embodiments, the second height H2 of one or more of the LED chips 12-1 to 12-3 may be substantially equal to the first height H1. As will be further described below, the first height H1 may also be less than the second height H2 at this stage of fabrication. Subsequent encapsulation and/or thinning steps may be applied that may ultimately provide the first height H1 that is close to or equal to the second height H2. In further embodiments, the contact pads 16-1, 16-2 may be formed at later fabrication steps. For example, an encapsulant may be first formed to cover the LED chips 12-1 to 12-3 and openings or vias may be formed in the encapsulant in which the contact pads 16-1, 16-2 may be deposited or plated.

FIG. 3B is a cross-sectional view of the light-emitting device 20 of FIG. 3A and further including a carrier 32 that is positioned for mounting over the LED chips 12-1 to 12-3 and the active electrical element 14. The carrier 32 includes a first face 32a and a second face 32b that opposes the first face 32a. As illustrated, the second face 32b is positioned closer to the LED chips 12-1 to 12-3 than the first face 32a. In certain embodiments, a number of electrical traces 34 are provided on the second face 32b that correspond with the contact pads 16-1, 16-2 and communicate electrical power and signals throughout the light-emitting device 20. While only two contact pads 16-1, 16-2 and corresponding electrical traces 34 are illustrated, any number of contact pads 16-1, 16-2 and corresponding electrical traces 34 may be provided without deviating from the principles of the disclosure.

Figure 3C:
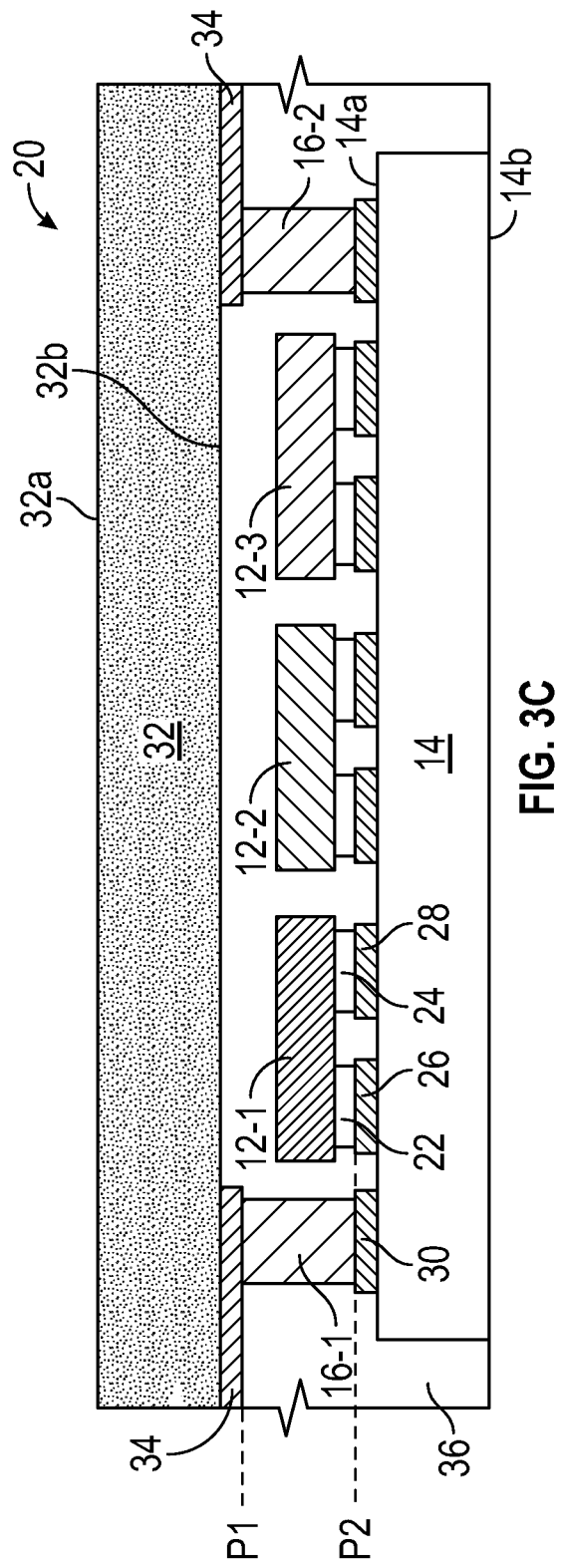
FIG. 3C is a cross-sectional view of the light-emitting device of FIG. 3B after mounting with the carrier.

FIG. 3C is a cross-sectional view of the light-emitting device 20 of FIG. 3B after mounting with the carrier 32. After mounting, the electrical traces 34 of the carrier 32 provide external electrical connections with the light-emitting device 20 at a first plane P1 where the contact pads 16-1, 16-2 are mounted to the electrical traces 34. The anode and cathode contacts 22, 24 of each of the LED chips 12-1 to 12-3 are electrically coupled with the active electrical element 14 along a second plane P2 that is closer to the first face 14a of the active electrical element 14 than the first plane P1. In this regard, the light-emitting device 20 may be mounted to the carrier 32 by bonding or soldering the contact pads 16-1, 16-2 to the corresponding electrical traces 34 with reduced stress on the previously mounted LED chips 12-1 to 12-3.

As previously described, the carrier 32 may comprise a light-transmissive material such that light emissions from the LED chips 12-1 to 12-3 may pass through the carrier 32. In this regard, a primary light-emitting face of each of the plurality of LED chips 12-1 to 12-3 may be positioned closer to the carrier 32 than the active electrical element 14. In certain embodiments, the carrier 32 may comprise a light-transmissive superstrate and the light-emitting device 20 may be devoid of another submount that is different than the active electrical element 14. The electrical traces 34 of the carrier 32 may comprise a light-transmissive material and/or the electrical traces 34 may be positioned on the carrier 32 to reduce interactions, absorptions, and or reflections with light generated by the LED chips 12-1 to 12-3. In certain embodiments, the electrical traces 34 may comprise a light transmissive and/or transparent conductive oxide, such as indium tin oxide (ITO) that is at least light-transmissive to wavelengths of light provided by the LED chips 12-1 to 12-3. Additionally, the electrical traces 34 may be arranged along portions of the carrier 32 that are registered with streets that are formed between lateral boundaries of the LED chips 12-1 to 12-3, thereby reducing interactions of emissions from the LED chips 12-1 to 12-3. In such an arrangement, one or more of the electrical traces 34 may also comprise metal traces. In certain configurations, ground and voltage power connections may be provided by metal traces while communication signals may be provided by transmissive and/or transparent conductive oxides. In such embodiments, certain ones of the electrical traces 34 may comprise transmissive and/or transparent conductive oxides that extend over one or more of the LED chips 12-1 to 12-3 while others of the electrical traces 34 comprise metal traces that are arranged in the streets. In further embodiments, different ones of the electrical traces 34 may be provided along different planes of the carrier 32 with dielectric materials therebetween to accommodate various routing configurations with the contact pads 16-1, 16-2.

As illustrated, the LED chips 12-1 to 12-3 are arranged between the active electrical element 14 and the carrier 32. After mounting, an encapsulant 36 or underfill may be provided to fill open spaces between the active electrical element 14 and the carrier 32. In certain embodiments, the encapsulant 36 may comprise a light-transmissive material such as silicone, glass, epoxy, organic polymers, hybrid organic polymers, or the like. The encapsulant 36 may be provided in various locations, including between the LED chips 12-1 to 12-3 and the carrier 32, between the anodes and cathodes 22, 24, between corresponding electrical traces 26, 28, and between the contact pads 16-1, 16-2 and the LED chips 12-1 to 12-3. In certain embodiments, a height of one or more of the LED chips 12-1 to 12-3 may be configured such that top surfaces of the one or more LED chips 12-1 to 12-3 are in contact with the carrier 32 after mounting. While the LED chips 12-1 to 12-3 are illustrated in a flip-chip mounting configuration, the principles disclosed may also be applicable to wirebond electrical connections for one or more of the LED chips 12-1 to 12-3. In this manner, the encapsulant 36 may further serve to encapsulate wirebonds in such configurations. In certain embodiments, the carrier 32 is configured to mount a plurality of active electrical elements 14 with LED chips 12-1 to 12-3 to form an LED pixel array across the second face 32b of the carrier 32. In this regard, the carrier 32 and the encapsulant 36 may extend beyond lateral boundaries or peripheral edges of each active electrical element 14 such that the encapsulant 36 is also provided between adjacent ones of the active electrical elements 14 of the LED pixel array. In other embodiments, a single active electrical element 14 or a group of active electrical elements 14 may be mounted to the carrier 32 for other lighting applications beyond LED displays, such as general lighting applications.

Figure 4:
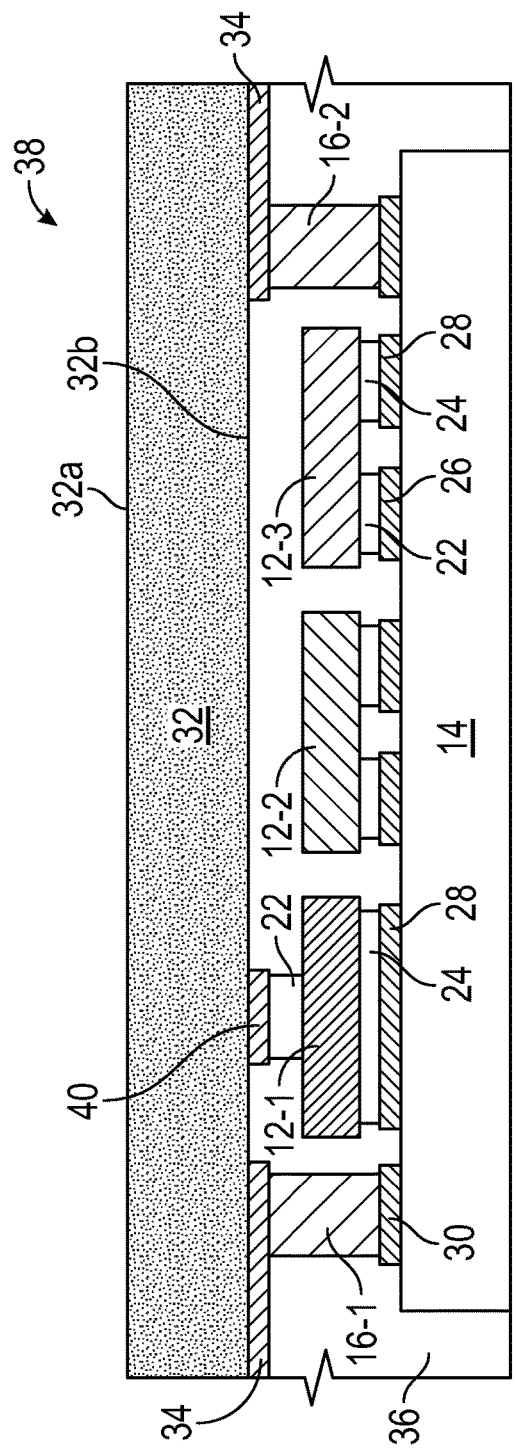
FIG. 4 is a cross-sectional view of a light-emitting device that is similar to the light-emitting device of FIG. 3C, and further includes an arrangement where at least one of the LED chips is electrically coupled to an electrical trace of the carrier.

FIG. 4 is a cross-sectional view of a light-emitting device 38 that is similar to the light-emitting device 20 of FIG. 3C, and further includes an arrangement where at least one of the LED chips 12-1 to 12-3 is electrically coupled to an electrical trace 40 of the carrier 32. In certain applications, at least one of the LED chips (e.g., 12-1 in FIG. 4) may be provided with a vertical contact configuration. In this regard, the anode contact 22 of the LED chip 12-1 may be electrically coupled to a corresponding electrical trace 40 on the second face 32b of the carrier 32 while the cathode contact 24 of the LED chip 12-1 may be electrically coupled to the electrical trace 28 of the active electrical element 14. In other embodiments, the order may be reversed such that the cathode contact 24 of the LED chip 12-1 is electrically coupled to the electrical trace 40 and the anode contact 22 of the LED chip 12-1 is electrically coupled to the electrical trace 28. In this regard, the electrical trace 40 may provide an external electrical connection to the LED chip 12-1 by way of the carrier 32. One or more of the other LED chips 12-2, 12-3 may be electrically coupled to the active electrical element 14 in a lateral flip-chip manner as previously described for FIG. 3A. In certain applications, vertically configured red LED chips may be more readily available and/or less expensive than laterally configured red LED chips. By providing one or more of the electrical traces 40 on the carrier 32, the light-emitting device 38 may accordingly be configured to accommodate one or more combinations of vertical and lateral LED arrangements. In certain embodiments, the vertically configured LED chip may generate other colors, including blue and green. In still further embodiments, all of the LED chip 12-1 to 12-3 may comprise vertically configured contact arrangements. While vertical and lateral contact arrangements for LED chips are disclosed above, the principles described herein may be applied to other semiconductor devices with vertical or lateral contact arrangements. For example, the light-emitting device 38 may be configured to include other semiconductor devices having vertical and/or lateral contact arrangements, including one or more electrostatic discharge (ESD) elements, another ASIC, a capacitor, and a resistor, among others.

Figure 5:
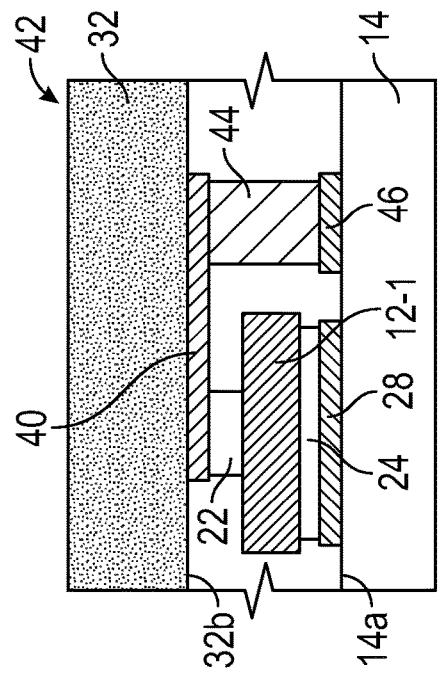
FIG. 5 is a partial cross-sectional view of a light-emitting device that is similar to the light-emitting device of FIG. 4, and further includes a return contact pad that provides part of an electrically conductive path from the LED chip to the active electrical element.

FIG. 5 is a partial cross-sectional view of a light-emitting device 42 that is similar to the light-emitting device 38 of FIG. 4, and further includes a return contact pad 44 that provides part of an electrically conductive path from the LED chip 12-1 to the active electrical element 14. As described above, some embodiments may include one or more semiconductor chips (e.g., LEDs, ESD elements, ASICs, capacitors, resistors) that include vertical contact structures. In an alternative configuration to FIG. 4, the electrical trace 40 of FIG. 5 is arranged to electrically connect with the anode contact 22 (or cathode contact depending on the chip configuration) of the vertically configured LED chip 12-1 and the return contact pad 44 that is electrically coupled to a corresponding electrical trace 46 of the active electrical element 14. In this regard, both the anode and cathode contacts 22, 24 of the LED chip 12-1 may be electrically coupled to the active electrical element 14 to provide similar connections as if the LED chip 12-1 were laterally configured as shown in FIG. 3A.

Figure 6A:
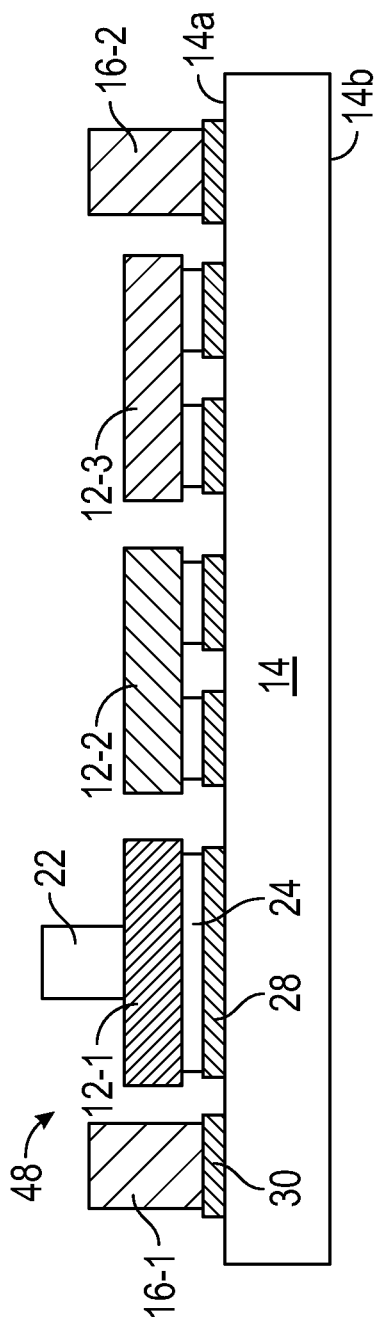
FIG. 6A is a cross-sectional view of another light-emitting device after LED chips are mounted to an active electrical element.
Figure 6B:
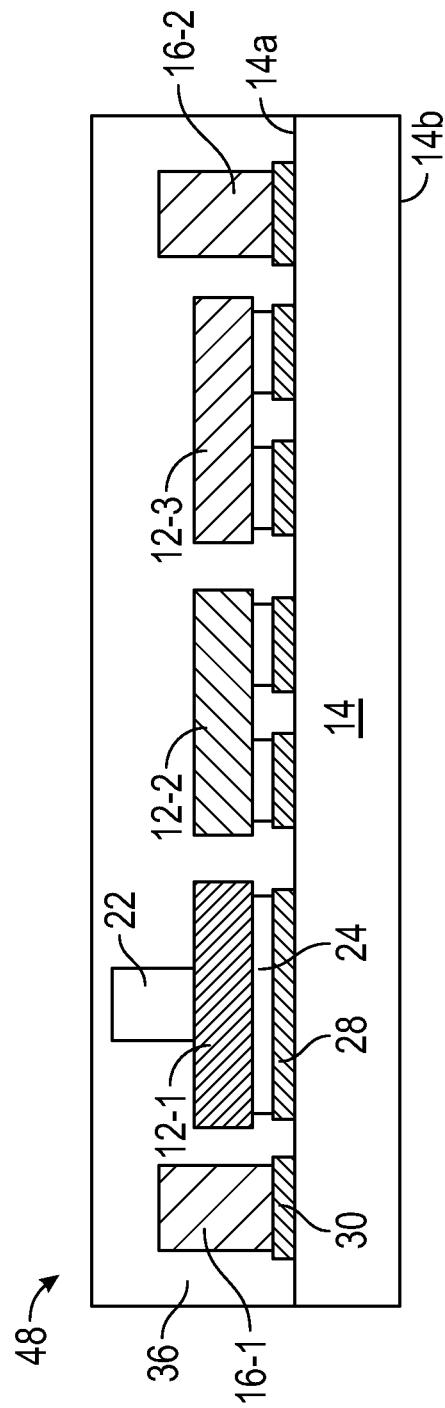
FIG. 6B is a cross-sectional view of the light-emitting device of FIG. 6A after an encapsulant is formed to cover the LED chips over the active electrical element.

FIGS. 6A-6D are cross-sectional views of a light-emitting device 48 that is similar to the light-emitting device 20 of FIG. 3C for embodiments where the encapsulant 36 is provided before the carrier 32 is mounted. FIG. 6A is a cross-sectional view of the light-emitting device 48 after the LED chips 12-1 to 12-3 are mounted to the active electrical element 14. In this regard, the light-emitting device 48 is similar to the light-emitting device 20 of FIG. 3A. In certain embodiments, at least one of the LED chips (e.g., 12-1 in FIG. 6A) may be provided with a vertical contact configuration similar to the light-emitting device 38 of FIG. 4. By way of example, the anode contact 22 of the LED chip 12-1 is arranged on an opposing face to the cathode contact 24 of the LED chip 12-1 (or vice-versa depending on the chip configuration). In certain embodiments, a height of the anode contact 22 may be higher than a height of the contact pads 16-1, 16-2 at this fabrication step, while in other embodiments, the anode contact 22 may be provided with a height that is equal to or less than the height of the contact pads 16-1, 16-2. It is understood that all of the LED chips 12-1 to 12-3 may be arranged with lateral contacts and flip-chip mounting configurations as illustrated for the LED chips 12-2, 12-3 in FIGS. 6A-6D. FIG. 6B is a cross-sectional view of the light-emitting device 48 after the encapsulant 36 is formed to cover the LED chips 12-1 to 12-3 over the active electrical element 14. As illustrated, the encapsulant 36 may also be formed to cover the contact pads 16-1, 16-2 and the anode contact 22 of the LED chip 12-1. In certain embodiments, the encapsulant 36 may be dispensed over the light-emitting device 48 and subsequently cured in place.

Figure 6C:
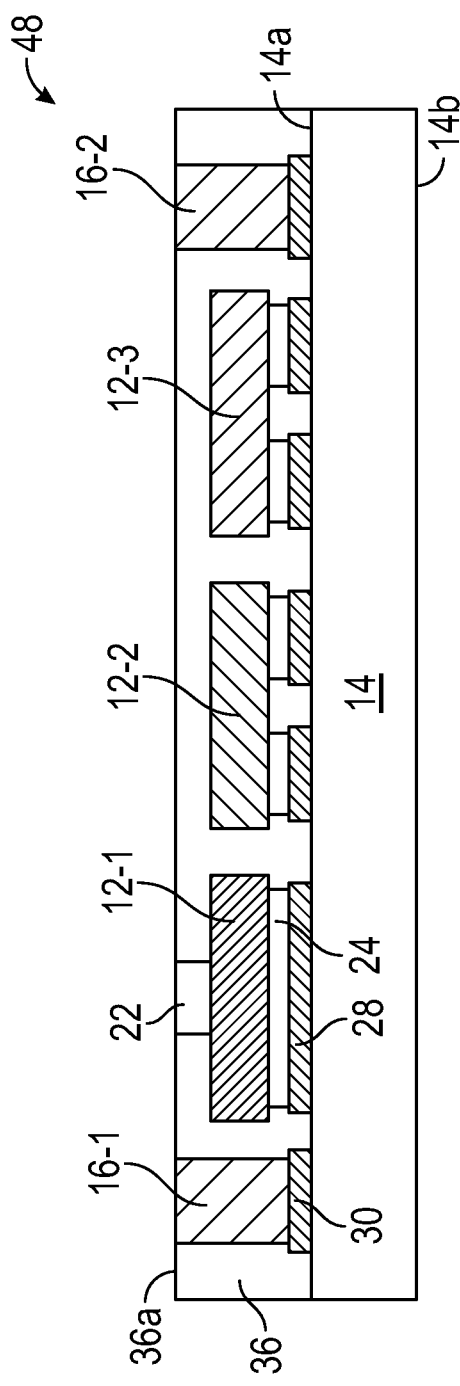
FIG. 6C is a cross-sectional view of the light-emitting device of FIG. 6B after a thinning step has been performed to reduce a thickness of the encapsulant and provide access to the contact pads.

FIG. 6C is a cross-sectional view of the light-emitting device 48 of FIG. 6B after a thinning step has been performed to reduce a thickness of the encapsulant 36 and provide access to the contact pads 16-1, 16-2 and the anode contact 22 of the LED chip 12-1. Many different thinning processes may be used including mechanical processes such as grinding, lapping or polishing, preferably after the encapsulant 36 has been cured. Other thinning steps may comprise a squeegee to thin the encapsulant 36 before curing or pressure planarization before the encapsulant 36 is cured. In still other embodiments, the encapsulant 36 may be thinned using physical or chemical etching or ablation. The thinning process may not only expose portions of the contact pads 16-1, 16-2 and the anode contact 22 of the LED chip 12-1, but also allows for planarizing of the encapsulant 36 and for control of a final thickness of the encapsulant 36 over the LED chips 12-1 to 12-3. As illustrated in FIG. 6C, after thinning, a top surface 36a of the encapsulant 36 may be coplanar with exposed portions of the contact pads 16-1, 16-2 and the anode contact 22 of the LED chip 12-1. In certain embodiments, a height of the contact pads 16-1, 16-2 (e.g., H1 of FIG. 3A) may initially be less than a height of one or more of the LED chips 12-1 to 12-3 (e.g., H2 of FIG. 3A). In this regard, the thinning step of FIG. 6C may also thin top portions of the one or more LED chips 12-1 to 12-3 to ultimately provide the same or similar height for both the contact pads 16-1, 16-2 and the one or more LED chips 12-1 to 12-3. In further embodiments, the contact pads 16-1, 16-2 may be provided after the encapsulant 36 is formed. For example, openings or vias may be formed in the encapsulant 36 in which the contact pads 16, 16-2 may subsequently be deposited or plated. Other processes variations may not require such thinning. For example, the encapsulant, 36 may be selectively removed only in the areas of the contact pads 16-1, 16-2 and the anode contact 22 of the LED chip 12-1, when present, by laser drilling or the like. Many other possible processing methods may also be applicable to produce significantly similar structures.

Figure 6D:
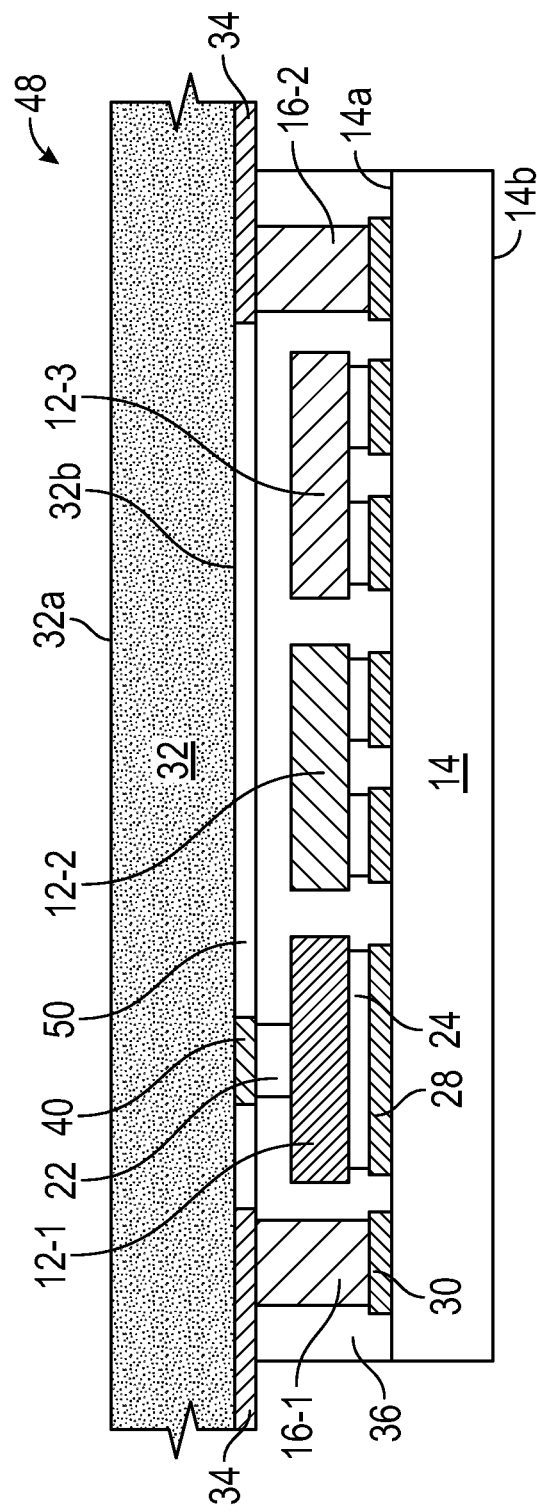
FIG. 6D is a cross-sectional view of the light-emitting device of FIG. 6C after mounting with a carrier.

FIG. 6D is a cross-sectional view of the light-emitting device 48 of FIG. 6C after mounting with the carrier 32. The carrier 32 is mounted such that the contact pads 16-1, 16-2 and the anode contact 22 of the LED chip 12-1 are electrically coupled with the corresponding traces 34, 40 of the carrier 32 as previously described. Since the encapsulant 36 has been thinned prior to mounting with the carrier 32, a gap 50 may be formed between the encapsulant 36 and portions of the carrier 32. In addition to being left unfilled, the gap 50 may be filled with additional encapsulant material that comprises a same material as the encapsulant 36. The gap 50 may also be filled with one or more materials that are different from the encapsulant 36, including a light-transmissive adhesive or a light-transmissive coating. In certain embodiments, the gap 50 is filled with a silicone material and the encapsulant 36 may also comprise a silicone material with a same or different hardness scale after curing. For example, the encapsulant 36 may comprise a higher hardness scale that the material that fills the gap 50. Alternatively, another encapsulant material may be formed over the second face 32b of the carrier 32 and thinned to provide access to the electrical traces 34 prior to mounting. In this regard, the gap 50 may at least partially be filled by the other encapsulant material provided on the carrier before mounting.

In certain embodiments, an active electrical element as described herein may be provided with a structure that is reconfigurable according to a variety of applications without major redesigns. In this regard, a substantial portion of the active electrical element may designed with a fixed or set structure capable of performing a variety of functions, and a top portion of the active electrical element may include one or more redistribution layers that provide electrical connections to different amounts and types of semiconductors depending on the specific application. As such, a common design may be used to manufacture active electrical elements in mass quantities and one or more redistribution layers may be subsequently added to tailor individual active electrical elements to a particular applications. Accordingly, active electrical elements may be designed with similar overall sizes and controls (e.g., analog and/or digital) that may be utilized across a variety of different applications.

FIG. 7 is a cross-sectional view of the active electrical element 14 configured with one or more redistribution layers 56 that tailor the active electrical element 14 to a particular application. As illustrated, the active electrical element 14 includes the contact pads 16-1 to 16-4 and the electrical traces 26, 28 configured to communicate with LED chips (e.g., 12-1 to 12-3) in a configuration that is similar to the light-emitting device 10 of FIG. 1. The active electrical element 14 may include a substrate 58 that supports one or more semiconductor layers 60, one or more connection layers 62, and the one or more redistribution layers 56. In certain embodiments, the substrate 58 may comprise a silicon substrate as silicon represents a common choice for semiconductor electronic devices. The substrate 58 may also comprise GaAs, germanium (Ge), indium phosphide (InP), and SiC, among others. The one or more semiconductor layers 60 may include elements that form at least part of an integrated circuit chip, an ASIC, a microcontroller, or an FPGA. Generally, the one or more semiconductor layers 60 may provide the nonlinear or active functionality of the active electrical element 14. Layers above the one or more semiconductor layers 60 provide intra and interconnectivity, along with passive functionality such as resistance, capacitance, and inductance. The one or more connection layers 62 may include a multilayer structure of conductive interconnects, conductive traces, and dielectric layers that provide a number of electrical connections to the various elements of the one or more semiconductor layers 60 along with passive functionality and connection with elements above. In certain embodiments, the one or more semiconductor layers 60 along with the one or more connection layers 62 may be configured to perform a variety functions that are applicable to different applications without requiring modification. In order to tailor the active electrical element 14 to a particular application, the redistribution layers 56 may be configured to receive and route electrical connections and signals between the remainder of the active electrical element 14 and provide appropriate connection pads for various other aspects such as LED contacts or pads, and power, sensor, and communication pads based on the requirements of a particular application. In this manner, the one or more redistribution layers 56 may also comprise a multilayer structure of conductive interconnects, conductive traces, and dielectric layers. By way of example, the active electrical element 14 includes the electrical traces 26, 28 configured to receive LED chips (e.g., 12-1 to 12-3) and four contact pads 16-1 to 16-4 that may be configured for coupling with voltage, ground, and communication input and output lines. As illustrated, the four contact pads 16-1 to 16-4 may be considered part of the redistribution layers 56. One or more redistribution layers 56-1 or sublayers that include various metal layers and insulating layers may be arranged between the contact pads 16-1 to 16-4 and the one or more connection layers 62. In this manner the one or more redistribution layers 56-1 are configured to provide separate electrical connections between the connection layers 62 and the three LED chips (e.g., 12-1 to 12-3) and the four contact pads 16-1 to 16-4. Accordingly, the one or more semiconductor layers 60 may be configured to provide a first function that includes receiving a control signal and actively maintaining an operating state of each of the LED chips (e.g., 12-1 to 12-3). In various embodiments, the substrate 58, the one or more semiconductor layers 60, and the one or more connection layers 62 may be fixed layers that are the same for active electrical elements configured for different applications. As such, the one or more semiconductor layers 60 may include functionality that is not used in every application. By employing different arrangements of the redistribution layers 56, the active electrical element 14 may be reconfigurable for a number of applications and functions.

FIG. 8 is a cross-sectional view an active electrical element 14' that is similar to the active electrical element 14 of FIG. 7 and further includes a different configuration of one or more redistribution layers 56' that tailor the active electrical element 14' to a different application than FIG. 7. By way of example, the active electrical element 14' includes six contact pads 16-1 to 16-6 in a configuration that is similar to the light-emitting device 18 of FIG. 2. Four of the contact pads (e.g., 16-1 to 16-4) may be configured for coupling with voltage, ground, and communication input and output lines and the additional contact pads (e.g., 16-5, 16-6) may be configured for at least one of voltage and current sensing applications such as touch sensing, temperature sensing, and/or ambient light sensing. The redistribution layer 56' may include one or more redistribution layers 56-1' or sublayers that include various metal layers and insulating layers, and the contact pads 16-1 to 16-6. The one or more redistribution layers 56-1' may be arranged between the contact pads 16-1 to 16-6 and the one or more connection layers 62. In this regard, the substrate 58, the one or more semiconductor layers 60, and the one or more connection layers 62 may be configured with a same or similar structure as the active electrical element 14 of FIG. 7 and only one or more different redistribution layers 56-1' and additional contact pads 16-5, 16-6 are utilized to configure the active electrical element 14' for a second function that additionally includes voltage and/or current sensing capabilities. In certain embodiments, the second function comprises one or more of driving additional LED chips (e.g., twelve LED chips that form four LED pixels), driving LED chips that are mounted on the active electrical element 14', electrically coupling the active electrical element 14' and LED chips along different or separate horizontal planes, combining multiple current outputs in parallel to form higher current outputs, reducing a number of contact pads of the active electrical element 14', and activating less than all elements of the semiconductor layers 60. For example, the active electrical elements 14, 14' of both FIG. 7 and FIG. 8 may comprise an ASIC formed by 20 to 25 mask levels in a manufacturing process. For a 25 mask level embodiment, the first 20 or so mask levels may correspond with the one or more semiconductor layers 60 and the one or more connection layers 62, and the last 5 or so mask levels may correspond with the redistribution layers 56 or 56'. Accordingly, active electrical elements 14, 14' may be mass produced up to the one or more connection layers 62 and the redistribution layers 56 or 56' may be added later depending on most current customer demands of the respective targeted application. Redistribution layers 56, 56' as described herein may provide a reconfigurable nature that allows active electrical elements to be configured for a variety of applications, such as active electrical elements as disclosed in U.S. Patent Application Publication No. 2020/0312231 A1 titled "ACTIVE CONTROL OF LIGHT EMITTING DIODES AND LIGHT EMITTING DIODE DISPLAYS," the entire contents thereof being hereby incorporated by reference herein.

While the active electrical elements 14, 14' of FIGS. 7 and 8 are illustrated without LED chips, LED chips may be provided to form light-emitting devices as previously described. In this regard, pre-formed light-emitting devices that include LED chips mounted on active electrical elements may be fabricated, sorted and binned for use in a variety of applications. FIG. 9 is a cross-sectional view of a light-emitting device 54 that includes the active electrical element 14 of FIG. 7 and one or more LED chips 12-1 to 12-3 mounted thereon. As previously described, the LED chips 12-1 to 12-3 may be provided in different arrangements, including vertical and lateral flip-chip configurations. By way of example, the LED chip 12-1 is illustrated with a vertical configuration and the LED chips 12-2, 12-3 are illustrated with lateral flip-chip configurations. In certain embodiments, the redistribution layer 56-1 may be configured differently for different embodiments to accommodate different LED chip configurations. For example, if the LED chip 12-1 were provided in a lateral flip-chip configuration similar to the LED chips 12-2, 12-3, the redistribution layer 56-1 may be reconfigured while the substrate 58, the one or more semiconductor layers 60, and the one or more connection layers 62 are unchanged.

FIG. 10 is a cross-sectional view of a portion of a light-emitting device 66 that is configured to receive at least one of a voltage sensing signal and a current sensing signal. For illustrative purposes, only the portion of the light-emitting device 66 that includes voltage and/or current sensing capabilities is shown. It is understood the light-emitting device 66 may otherwise be configured similar to any of the previously-described embodiments. By way of example, the light-emitting device 66 includes a capacitive touch element 68 or sensor as indicated by the superimposed dashed-line box. In certain embodiments, the capacitive touch element 68 is arranged on the second face 32b of the carrier 32 and in other embodiments, the capacitive touch element 68 may be arranged within or embedded in the carrier 32. The capacitive touch element 68 may include a number of electrical traces 70, 72 that are electrically coupled with the active electrical element 14. For example, the contact pads 16-5, 16-6 may provide such electrical connections. While the electrical trace 70 is shown in segments, the electrical trace 70 may actually be continuous around portions of the electrical trace 72 along areas of the carrier 32 that are out of plane from the cross-section of FIG. 10. In this manner, both segments of the electrical trace 70 illustrated in FIG. 10 may be electrically coupled to the active electrical element 14 by the contact pad 16-5. In certain embodiments, the electrical traces 70, 72 comprise light-transmissive and/or light-transparent conductive materials such as ITO so that the capacitive touch element 68 may be formed in any location of the carrier 32, including in a light path of LED chips. When the light-emitting device 66 is arranged as part of larger array of LED pixels with corresponding active electrical elements, touch sensing capability allows the individual active electrical element 14 to respond to various touch commands independent from other active electrical elements that may be present in the larger array.

FIG. 11A and FIG. 11B are cross-sectional views of a portion of the carrier 32 that includes the capacitive touch element 68 of FIG. 10 and further illustrate behavior of an electric field 74 from the capacitive touch element 68 with and without interaction from a conductor 76. In FIG. 11A, the electric field 74 may be formed when a small voltage is applied to the electrical traces 70, 72 by the active electrical element 14 as illustrated in FIG. 10. In FIG. 11B, when the conductor 76 is positioned on or near the first face 32a of the carrier 32, a portion of the electric field 74 interacts with the conductor 76. In this manner, the interaction between the electric field 74 and the conductor 76 may then be detected by capacitive sensing circuitry that may be included within the active electrical element (14 of FIG. 10) by way of the contact pads (16-5, 16-6 of FIG. 10). In certain embodiments, the conductor 76 may comprise a finger of a user touching the carrier 32, a conductive stylus, or the like.

FIGS. 12A, 12B, and 12C illustrate various configurations of capacitive touch elements 68 according to embodiments of the present disclosure. In FIG. 12A, the electrical trace 70 forms a hollow square or rectangular shape that laterally surrounds the electrical trace 72 on the second face 32b of the carrier 32. The capacitive touch element 68 is thereby formed as indicated by the superimposed dashed line box of FIG. 12A. In a similar manner, FIG. 12B illustrates an embodiment where the electrical trace 70 forms a hollow circular shape that laterally surrounds the electrical trace 72 on the second face 32b of the carrier 32. The capacitive touch element 68 is thereby formed as indicated by the superimposed dashed line circle of FIG. 12B. FIG. 12C illustrates an interlocking comb pattern for the electrical traces 70, 72 that may be used for greater touch sensitivity. In the embodiments shown in FIGS. 12A 12B, and 12C, the capacitive touch element 68 may be formed in a manner that allows touch sensing for a particular LED pixel and corresponding active electrical element. Notably, this approach allows both electrical traces 70 and 72 to be produced on the same layer, thereby providing a simplified design.

FIGS. 13A and 13B illustrate examples where the capacitive touch element 68 is configured to provide fine resolution touch sensing for multiple positions within a particular LED pixel and corresponding active electrical element. As illustrated in FIG. 13A, the electrical traces 70, 72 may be provided on different horizontal layers of the carrier 32 such that the electrical trace 70 is separated from the electrical trace 72 by one or more insulating layers 78. In certain embodiments, the electrical traces 70, 72 may be crossed to form a pattern of horizontal and vertical rows and columns that may be electrically scanned to determine the touch position. While certain ones of the electrical traces 70, 72 are illustrated as segments, each of the electrical traces 70, 72 may be continuous along areas of the carrier 32 that are out of plane from the cross-sectional view of FIG. 13A. As illustrated, portions of the electrical trace 70 are laterally offset from portions of the electrical trace 72, with the spaces therebetween occupied by the one or more insulating layers 78. In this manner, an electric field as illustrated in FIGS. 11A and 11B may be generated.

FIG. 13B is an expanded bottom view taken from the second face 32b of the carrier 32 of FIG. 13A for embodiments where the electrical traces 70, 72 form the capacitive touch element 68 in a grid array. As illustrated, the electrical traces 70-1 to 70-3 and 72-1 to 72-3 are segmented into multiple rows and columns to form a grid array that provides finer resolution for capacitive touching. In this expanded view, the capacitive touch element 68 requires additional connection points for the various row and column traces in order to achieve the high resolution touch sensing capability. In certain embodiments, the capacitive touch element 68 as illustrated in FIG. 13B may be formed across an entire area of the carrier 32 that is registered with an active electrical element after mounting. In this regard, fine resolution touch sensing may be provided for multiple locations of an individual active electrical element. In other embodiments, the capacitive touch element 68 as illustrated in FIG. 13B may be formed across smaller areas of the carrier 32, such as only in areas of the carrier 32 that are registered with LED chips. Many applications may not require touch resolution greater than the pixel resolution and as such, embodiments similar to those in FIGS. 12A, 12B, and 12C may be sufficient. However, high resolution touch sensing capability as shown in FIGS. 13A and 13B may be well suited for various applications, such as enabling the ability to select a primary color of a LED pixel. In addition, the high resolution scanning arrangement of FIGS. 13A and 13B may also be well suited for multiple LED pixel arrays that are mounted on a common active electrical element, as will be further described in greater detail below.

While previously described examples are provided that illustrate LED chips forming a single LED pixel on an active electrical element, the embodiments disclosed herein are not so limited. In any of the previously described embodiments, a plurality of LED pixels may mounted on and electrically coupled to a common active electrical element. FIG. 14A is a perspective view of a light-emitting device 80 where multiple groups of LED chips 12-1 to 12-3 form an array of LED pixels that are arranged on and electrically coupled to a common active electrical element 14". In certain embodiments, each LED pixel (e.g., individual group of LED chips 12-1 to 12-3) may be spaced equal distances from other LED pixels of the light-emitting device 80 so that when formed as part of a larger array, a pixel pitch may be maintained across arrays of the light-emitting devices 80. The active electrical element 14" may include the contact pads 16-1 to 16-4 that are arranged to receive external electrical connections, and the active electrical element 14" is configured to separately control each of the LED chips 12-1 to 12-3 of each of the LED pixels. Notably, the multiple LED pixel embodiment of FIG. 14A may utilize the same number of contact pads 16-1 to 16-4 as any of the previously described single LED pixel embodiments. In this manner, additional LED pixels may be controlled without increasing a number of electrical connection lines. A carrier as previously described may be attached to contact pads 16-1 to 16-4 and over the LED chips 12-1 to 12-3. In certain embodiments, multiple active electrical elements 14, each having multiple groups of LED chips 12-1 to 12-3 that form an arrays of LED pixels, may be attached to a common carrier to form a larger LED display. As described in FIGS. 7 and 8, active electrical elements 14, 14' can be made reconfigurable even to the extent of having the ability to be reconfigured from the relatively simpler embodiment of FIG. 1 to the more complex embodiment of FIG. 14A. Since layers 58, 60, and 62 of FIGS. 7 and 8 generally do not change, the size of the active electrical element 14, 14' may be fixed. However, to accommodate the additional requirements of FIG. 14A, four adjacent LED pixels may be combined into the one light-emitting device 80. As such, the active electrical element 14" of FIG. 14A may comprise a larger size with a different arrangement of the redistribution layer to facilitate a different contact pattern for the LED chips 12-1 to 12-3. FIG. 14B and FIG. 14C are respective top views of light-emitting devices 80, 80" that are similar to the light-emitting device 80 of FIG. 14A, with alternative layouts of the LED chips 12-1 to 12-3 and contact pads 16-1 to 16-4. In FIG. 14B, groups of the LED chips 12-1 to 12-3 form multiple (e.g., four in FIG. 14B) LED pixels that are arranged closer to corners of the light-emitting device 80' than the contact pads 16-1 to 16-4. In FIG. 14C, additional contact pads 16-5, 16-6 are centrally positioned in the light-emitting device 80". As illustrated in the embodiments of FIGS. 14B and 14C, the active electrical element 14 may be reconfigurable by way of the previously-described redistribution layers to accommodate a variety of alternative layouts.

FIG. 15 is a top perspective view of a portion of a light-emitting device 82 that includes multiple active electrical elements 14 having LED chips 12-1 to 12-3 that form an LED pixel array. As illustrated, each of the active electrical elements 14 comprises LED chips 12-1 to 12-3 mounted thereon. In certain embodiments, the LED chips 12-1 to 12-3 form a single LED pixel similar to the light-emitting device 10 of FIG. 1. In other embodiments, the LED chips 12-1 to 12-3 may form multiple LED pixels on each active electrical element 14 similar to the light-emitting device 80 of FIG. 14. The carrier 32 with electrical traces as previously described is attached across the multiple active electrical elements 14 to provide external electrical connections. As illustrated, a number of external electrical connectors 84 may be electrically coupled to the carrier 32 (e.g., various electrical traces of the carrier 32) and accordingly routed to the active electrical elements 14 for control of the LED chips 12-1 to 12-3. Depending on the application for the light-emitting device 82, different ones of the electrical connectors 84 may provide voltage and ground connections as well as various communication signals including color select signals, brightness level (or grey level) signals, analog signals, encoded color select signals, encoded brightness level select signals, digital signals, clock signals, and asynchronous data signals. In certain embodiments, the light-emitting device 82 forms an LED display. In other embodiments, a plurality of light-emitting devices 82 may be arranged in a tiled manner to form a larger LED display. By positioning the LED chips 12-1 to 12-3 on corresponding active electrical elements 14 to form LED pixels, such devices may be prefabricated and binned according to different specifications before mounting with the carrier 32. In certain embodiments, such devices may also be suitable for mass transfer. Additionally, the spacing or pitch of LED pixels may be set without requiring continuous material between adjacent LED pixels, such as continuous Si material or a PCB serving as a substrate for the LED pixels.

FIGS. 16A to 16C illustrate respective cross-sectional views of a light-emitting device 86 according to embodiments where one or more active electrical elements 14 with LED chips 12-1 to 12-3 mounted thereon may be arranged on a substrate panel 88. In FIG. 16A, multiple active electrical elements 14 and corresponding LED chips 12-1 to 12-3 are arranged on the substrate panel 88. In certain embodiments, the substrate panel 88 may comprise a thermally conductive material that facilitates heat dissipation from the active electrical elements 14 and LED chips 12-1 to 12-3. For example, the substrate panel 88 may comprise one or more of a ceramic material (e.g., alumina, AlN, etc.) and a metal material (e.g., aluminum, copper, and alloys thereof). The base substrate may also comprise a glass-reinforced epoxy laminate material such as FR-4, a bismaleimide-triazine (BT), or any type of PCB. The substrate panel 88 may have electrical traces 90 on one or both of a front side and a backside of the substrate panel 88 or within the substrate panel 88 depending on the application. By way of example, the electrical traces 90 of FIG. 16A are illustrated on the backside. Additionally, one or more electrically conductive vias 92 may be provided that extend through the substrate panel 88 to provide front side to backside communication as well as communication with any electrical traces within the substrate panel 88. Certain ones of the electrical traces 90 on the backside of the substrate panel 88 may form additional pads and routing for more system electronic components, such as microcontrollers, FPGAs, memory elements, transceivers, drivers, connectors, passive or active components, among others. One or more of the electrical connectors 84 may be arranged on the front side of the substrate panel 88 to provide one or more of voltage and ground connections as well as various communication signals including color select signals, brightness level (or grey level) signals, analog signals, encoded color select signals, encoded brightness level select signals, digital signals, clock signals, and asynchronous data signals. After the active electrical elements 14 are bonded or otherwise mounted to the substrate panel 88, the encapsulant 36 may be provided that covers the contact pads 16-1, 16-2, the electrical connectors 84, and the anodes 22 (or cathodes) of any vertically arranged LED chips 12-1 that may be present. As illustrated in FIG. 16B, the encapsulant 36 may then be thinned as previously described to expose the contact pads 16-1, 16-2, the anodes 22 (or cathodes) of any vertically-arranged LED chips 12-1, and the electrical connectors 84 of the substrate panel 88. Subsequent lithography, metal deposition, and/or encapsulation including multiple lithography steps with conductor and insulator layers may be used to form more complicated structures.

In FIG. 16C, a light-transmissive layer 94 is formed to cover one or more portions of the encapsulant 36 of the light-emitting device 86 of FIG. 16B. In certain embodiments, the light-transmissive layer 94 may comprise a same material as the encapsulant 36. In other embodiments, the light-transmissive layer 94 may comprise the carrier 32 as previously described for FIG. 3B. A number electrical traces 96 may be provided on the encapsulant 36 to provide electrical connections with the contact pads 16-1, 16-2, the anodes 22 (or cathodes) of any vertically-arranged LED chips 12-1, and the electrical connectors 84. For embodiments where the light-transmissive layer 94 is a similar material to the encapsulant 36, the electrical traces 96 may be deposited on the thinned encapsulant 36 before the light-transmissive layer 94 is formed. For embodiments where the light-transmissive layer 94 is similar to the carrier 32 of FIG. 3B, the electrical traces 96 may be provided on the light-transmissive layer 94 before mounting. In various embodiments, the electrical traces 96 may be arranged in a planar configuration along a same horizontal plane. By providing the active electrical elements 14 on the substrate panel 88 and thinning the encapsulant 36 as illustrated in FIGS. 16A to 16C, the light-transmissive layer 94 and electrical traces 96 may be provided without formation of the gap 50 as illustrated in FIG. 6D. Additionally, the substrate panel 88 and electrical traces 90 may provide interface options for other electronics 98, such as one or more FPGAs, microcontrollers, memory elements, transceivers, resistors, capacitors, connectors, semiconductor devices, and passive components.

FIG. 17 is a cross-sectional view of a light-emitting device 100 that is similar to the light-emitting device 86 of FIGS. 16A-16C, except the LED chips 12-1 to 12-3 are arranged outside or apart from the active electrical elements 14. By employing the substrate panel 88, one or more active electrical elements 14 and corresponding groups of LED chips 12-1 to 12-3 may be arranged adjacent to one another on the substrate panel 88. In this regard, the active electrical elements 14 may be configured to receive and route voltage/ground and various communication signals for the corresponding LED chips 12-1 to 12-3. The encapsulant 36 may be formed to expose portions of the contact pads 16-1 to 16-3, the anodes 22 and/or cathodes 24 of the LED chips 12-1 to 12-3, and the electrical connectors 84. The light-transmissive layer 94 is provided in a similar manner as described in FIG. 16C. For illustrative purposes, the electrical traces 96 are illustrated as rectangles; however, the electrical traces 96 may comprise multiple layers of traces and dielectric layers to provide electrical coupling with the active electrical elements 14, the LED chips 12-1 to 12-3, and the electrical connectors 84. In certain embodiments, at least a portion of the electrical traces 96 may form a touch sensing element as previously described.

FIG. 18 is a cross-sectional view of a light-emitting device 102 that is similar to the light-emitting device 100 of FIG. 17 and further includes a touch sensing element, such as the capacitive touch element 68 as previously described. In FIG. 18, the capacitive touch element 68 is provided on a topside or top face of the light-transmissive layer 94 in order to be closer an exterior of the light-emitting device 102 for improved touch sensing. For illustrative purposes, electrical connections between the capacitive touch element 68 and the electrical traces 96 are not shown, but it is understood such electrical connections may be provided as one or more conducting and insulating layers. Such arrangement may also be applicable for the embodiments of FIGS. 10, 11A-11B, 12A-12C, and 13A-13B. In other embodiments, the capacitive touch element 68 may be provided within the light-transmissive layer 94 or on a bottom side or bottom face of the light-transmissive layer 94 or as part of or in conjunction with the electrical traces 96. In still further embodiments, the capacitive touch element 68 could also be arranged on a surface of the substrate panel 88 if the overall height of the light-emitting device 102 device is suitably thin for sufficiently receiving an exterior sensing signal. As illustrated, the LED chip 12-1 may be configured as a vertical chip as previously described and the LED chips 12-2, 12-3 may be configured in lateral flip-chip mounted arrangements. For illustrative purposes, electrical traces of the substrate panel 88 for receiving flip-chip mounted LED chips (e.g., 12-2, 12-3) are not shown. By way of example, the LED chip 12-1 may comprise a vertically-arranged red LED chip with an anode 22 (or cathode) electrically coupled to a corresponding one of the electrical traces 96 of the light-transmissive layer 94 and the LED chips 12-2, 12-3 may respectively comprise laterally-arranged and flip-chip mounted blue and green LED chips electrically coupled to corresponding electrical connections of the substrate panel 88. In further embodiments, all of the LED chips 12-1 to 12-3 may comprise laterally-arranged and flip-chip mounted LEDs. By reducing an overall amount of electrical traces between the LED chips 12-1 to 12-3 and the light-transmissive layer 94, overall brightness may be increased.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting device comprising:
an active electrical element comprising:
a first face and a second face that opposes the first face; and
one or more electrically conductive contact pads on the first face that are electrically coupled to one or more external electrical connections at a first plane that is above the first face;
at least one light-emitting diode (LED) on the first face, the at least one LED comprising at least one anode or cathode contact that is electrically coupled with the active electrical element along a second plane that is closer to the first face than the first plane; and
a carrier on the active electrical element such that the at least one LED is between the carrier and the active electrical element, the carrier comprising one or more electrical traces that form the one or more external electrical connections to the one or more electrically conductive contact pads at the first plane.

2. The light-emitting device of claim 1, wherein the at least one anode or cathode contact is mounted to corresponding electrical traces that are on the first face of the active electrical element.

3. The light-emitting device of claim 1, wherein the carrier is light-transmissive to wavelengths of light generated by the at least one LED.

4. The light-emitting device of claim 1, wherein the one or more electrical traces comprise a transparent conductor.

5. The light-emitting device of claim 4, wherein the one or more electrical traces comprise indium tin oxide.

6. The light-emitting device of claim 1, wherein the one or more electrical traces comprise at least one transparent conductor and at least one metal layer.

7. The light-emitting device of claim 1, wherein the one or more electrical traces form a capacitive touch sensor.

8. The light-emitting device of claim 1, further comprising one or more additional contact pads on the first face that are configured to receive at least one of a voltage sensing signal and a current sensing signal.

9. The light-emitting device of claim 8, wherein the at least one of a voltage sensing signal and a current sensing signal comprises a touch sensing signal.

10. The light-emitting device of claim 1, wherein a height of the at least one LED is less than a height of the one or more electrically conductive contact pads.

11. The light-emitting device of claim 1, wherein the at least one LED comprises a plurality of LEDs that form an LED pixel on the first face of the active electrical element.

12. The light-emitting device of claim 1, wherein the at least one LED comprises a plurality of LEDs that form a plurality of LED pixels on the first face of the active electrical element.

13. The light-emitting device of claim 1, wherein the active electrical element is configured to receive a control signal and actively maintain an operating state of the at least one LED.

14. The light-emitting device of claim 1, wherein the active electrical element comprises an application-specific integrated circuit.

15. A light-emitting device comprising:
at least one light emitting diode (LED);
an active electrical element electrically coupled to the at least one LED, the active electrical element comprising a first face and a second face that opposes the first face, and one or more electrically conductive contact pads on the first face, and the at least one LED being on the first face; and
a carrier on the active electrical element such that the at least one LED is between the carrier and the active electrical element, the carrier comprising one or more electrical traces that are electrically coupled with the one or more electrically conductive contact pads at a first plane that is above the first face to receive at least one of a voltage sensing signal and a current sensing signal.

16. The light-emitting device of claim 15, wherein the at least one of a voltage sensing signal and a current sensing signal comprises a touch sensing signal.

17. The light-emitting device of claim 15, wherein the carrier is light-transmissive to wavelengths of light generated by the at least one LED.

18. The light-emitting device of claim of claim 15, wherein the one or more electrical traces form a capacitive touch sensor.

19. The light-emitting device of claim of claim 18, wherein the one or more electrical traces comprise a first trace that is laterally surrounded by a second trace on a face of the carrier to form the capacitive touch sensor.

20. The light-emitting device of claim 18, wherein the one or more electrical traces comprise a first trace that is separated from a second trace by an insulating layer to form the capacitive touch sensor.

21. The light-emitting device of claim of claim 20, wherein the first trace and the second trace form a grid array across an area of the carrier to form the capacitive touch sensor.

22. The light-emitting device of claim 21, wherein the active electrical element comprises an application-specific integrated circuit.

* * * * *